(12) United States Patent
Xu et al.

(10) Patent No.: US 12,727,192 B2
(45) Date of Patent: Sep. 1, 2026

(54) METAL-OXIDE SEMICONDUCTOR FIELD-EFFECT TRANSISTOR HAVING ENHANCED HIGH-FREQUENCY PERFORMANCE

(71) Applicant: SHANGHAI BRIGHT POWER SEMICONDUCTOR CO., LTD., Shanghai (CN)

(72) Inventors: Shuming Xu, Shanghai (CN); Lei Shi, Shanghai (CN); Jian Wu, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 599 days.

(21) Appl. No.: 18/079,031

(22) Filed: Dec. 12, 2022

(65) Prior Publication Data

US 2023/0343869 A1 Oct. 26, 2023

(30) Foreign Application Priority Data

Apr. 22, 2022 (CN) ......................... 202210426847.0

(51) Int. Cl.

| | |
|---|---|
| ***H10D 30/65*** | (2025.01) |
| ***H10D 64/00*** | (2025.01) |
| ***H10W 10/00*** | (2026.01) |
| ***H10W 10/13*** | (2026.01) |

(52) U.S. Cl.

CPC ........... *H10D 30/65* (2025.01); *H10D 64/111* (2025.01); *H10W 10/012* (2026.01); *H10W 10/13* (2026.01)

(58) Field of Classification Search

CPC ........... H10D 30/0212; H10D 30/0281; H10D 30/0285; H10D 62/116; H10D 62/157; H10D 64/516; H10D 64/663

See application file for complete search history.

(56) References Cited

U.S. PATENT DOCUMENTS

2014/0035064 A1* 2/2014 Clark, Jr. ............... H10D 62/40 438/234
2014/0231911 A1* 8/2014 Kim ..................... H10D 64/111 438/286

(Continued)

FOREIGN PATENT DOCUMENTS

CN 111463263 A * 7/2020 ......... H01L 29/0684

*Primary Examiner* — Fazli Erdem
(74) *Attorney, Agent, or Firm* — Myers Bigel, P.A.

(57) ABSTRACT

An LDMOS device includes a semiconductor substrate of a first conductivity type, a doped drift region of a second conductivity type formed on at least a portion of the substrate, and a body region of the first conductivity type formed in the drift region. Source and drain regions of the second conductivity type are formed proximate an upper surface of the body region and drift region, respectively, and spaced laterally from one another. A gate structure is disposed between the source and drain regions and includes a control gate formed over the body region, and a field plate formed over the drift region, the gate structure being electrically isolated from the body and drift regions by a first insulating layer. An oxide structure is formed on a portion of the field plate and a portion of the drift region, the oxide structure overlapping a corner of the field plate.

17 Claims, 17 Drawing Sheets

(56) References Cited

U.S. PATENT DOCUMENTS

| | | | | |
|---|---|---|---|---|
| 2014/0346597 | A1* | 11/2014 | Feilchenfeld | H10D 30/0281 438/286 |
| 2021/0234042 | A1* | 7/2021 | Xu | H10D 30/655 |
| 2022/0336593 | A1* | 10/2022 | Chen | H01L 21/76224 |

* cited by examiner

METAL-OXIDE SEMICONDUCTOR FIELD-EFFECT TRANSISTOR HAVING ENHANCED HIGH-FREQUENCY PERFORMANCE

CROSS-REFERENCE TO RELATED APPLICATIONS

The present application is a counterpart of, and claims priority to, Chinese Patent Application No. 202210426847.0, filed on Apr. 22, 2022 (DAS Code 6AEF), the disclosure of which is incorporated by reference herein in its entirety for all purposes.

BACKGROUND

The present invention relates generally to the electrical, electronic and computer arts, and, more particularly, to metal-oxide semiconductor field-effect transistor devices.

Modern wireless communication circuits and systems have placed extremely stringent requirements on both power and linearity performance of, for example, power amplifiers and switching circuitry operating at microwave frequencies. These ever-increasing power and linearity requirements have placed a challenging burden on the design of high-frequency, high-power circuit components. Silicon laterally-diffused metal-oxide semiconductor (LDMOS) power transistors have dominated such applications over the past years. However, with the approaching limits of operability for such devices, there will be a need for other semiconductor materials and/or device architectures to fulfill the high-power and high-linearity requirements of next generation wireless technology.

It is well known to employ a field plate structure in an LDMOS device. A field plate is essentially an extension of the gate over a drift region in the LDMOS device. The field plate, which is typically formed of polysilicon, has been shown to not only enhance breakdown voltage in the LDMOS device but also to suppress a surface state, which markedly affects the power performance of the device. The large gate polysilicon area also helps to accumulate electrons in the drift region under the field plate during an on-state of the LDMOS device, thereby reducing an on-resistance ($R_{DSon}$) of the device.

Unfortunately, while the field plate structure in a conventional MOSFET device helps to increase the breakdown voltage of the device through modulating the electric field locally, it introduces additional parasitic feedback capacitance, also referred to as Miller capacitance, from drain to gate ($C_{gd}$). More particularly, from a circuit standpoint, the field plate behaves as a gate-to-drain feedback capacitor which provides additional modulation of signals at the input and output of the device. Such parasitic feedback capacitance undesirably impacts the overall high-frequency performance of the device, particularly in high-speed switching applications, due at least in part to the additional phase variations provided through the feedback path.

SUMMARY

The present invention, as manifested in one or more embodiments, beneficially provides an enhanced field plate structure for use in an LDMOS transistor device, and methods for fabricating such a device. This field plate structure is advantageously compatible with existing complementary metal-oxide semiconductor (CMOS) fabrication technology and does not rely on the use of costly processes and materials, such as, for instance, a dual silicide field plate structure, to achieve a substantial improvement in device high-frequency performance. Moreover, embodiments of the present invention advantageously achieve enhanced high-frequency performance, for example by reducing gate charge ($Q_g$) and/or reducing gate-to-drain capacitance ($C_{gd}$), without significantly degrading breakdown voltage and/or on-resistance ($R_{DSon}$) in the device.

In accordance with an embodiment of the invention, a high-frequency LDMOS device includes a semiconductor substrate of a first conductivity type, a doped drift region of a second conductivity type formed on at least a portion of the substrate, the second conductivity type being opposite in polarity to the first conductivity type, and a body region of the first conductivity type formed in the doped drift region proximate an upper surface of the doped drift region. Source and drain regions of the second conductivity type are formed proximate an upper surface of the body region and doped drift region, respectively, and spaced apart laterally from one another. A gate structure in the LDMOS device includes a control gate formed over at least a portion of the body region, and a field plate formed over at least a portion of the doped drift region, the gate structure being disposed between the source and drain regions and electrically isolated from the body and doped drift regions by a first insulating layer formed between the gate structure and the body and doped drift regions. An oxide structure is formed on a portion of the field plate and a portion of the doped drift region, the oxide structure overlapping a corner of the field plate.

In accordance with an embodiment of the invention, a method of fabricating a high-frequency LDMOS device includes: forming a doped drift region of a first conductivity type on at least a portion of a semiconductor substrate of a second conductivity type, the second conductivity type being opposite in polarity to the first conductivity type; forming a body region of the second conductivity type in the doped drift region proximate an upper surface of the doped drift region; forming source and drain regions of the first conductivity type proximate an upper surface of the body region and doped drift region, respectively, and spaced apart laterally from one another; forming a gate structure comprising a control gate and a field plate, the control gate being formed over at least a portion of the body region, the field plate being formed over at least a portion of the doped drift region, the gate structure being disposed between the source and drain regions and electrically isolated from the body and doped drift regions by a first insulating layer formed between the gate structure and the body and doped drift regions; and forming an oxide structure on a portion of the field plate and a portion of the doped drift region, the oxide structure overlapping a corner of the field plate.

Techniques of the present invention can provide substantial beneficial technical effects. By way of example only and without limitation, an LDMOS device according to one or more embodiments of the invention may provide one or more of the following advantages:

lower on-state resistance $R_{DS\text{-}on}$
lower parasitic capacitance;
lower switching loss
higher frequency application.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
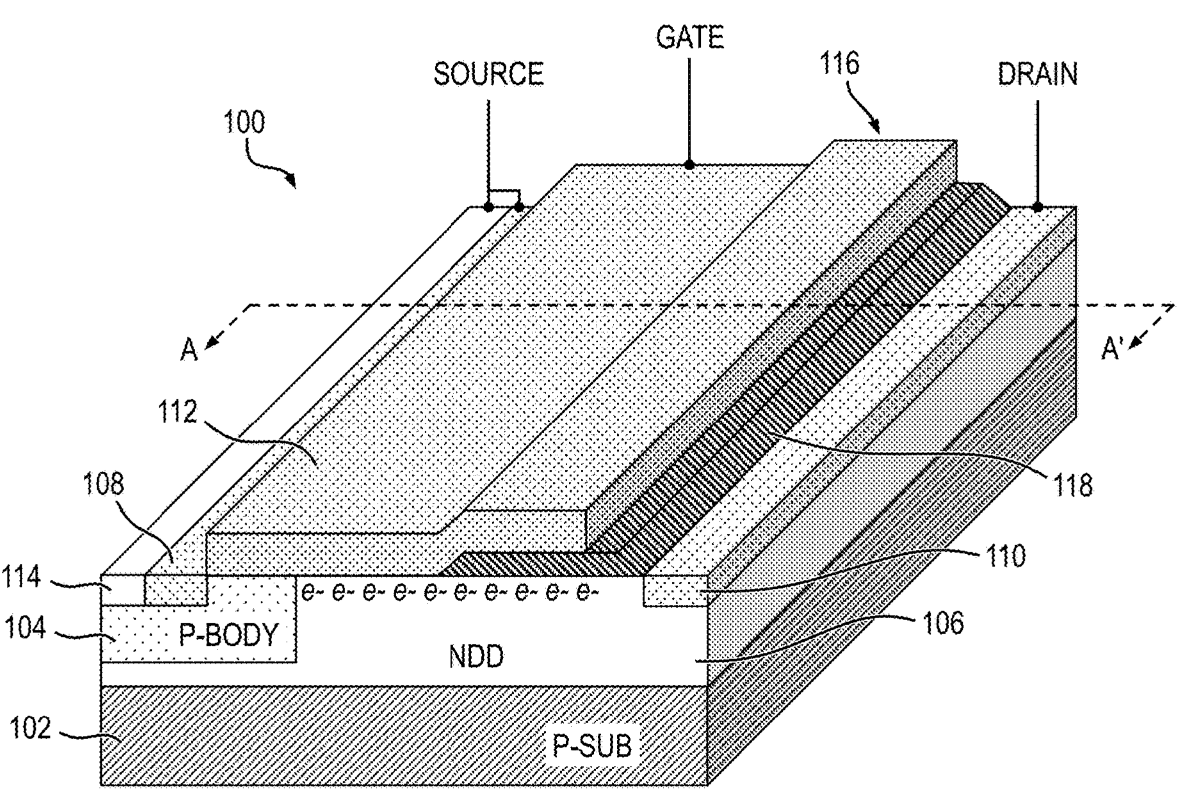
FIG. 1A is a perspective view depicting at least a portion of an illustrative laterally-diffused metal-oxide semiconductor (LDMOS) device having a field plate.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of an illustrative laterally-diffused metal-oxide semiconductor (LDMOS) device, and methods for fabricating an LDMOS device, having a field plate structure configured to enhance high-frequency performance without significantly degrading power and linearity performance in the device. It is to be appreciated, however, that the invention is not limited to the specific devices and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal material such as, for instance, polysilicon; the terms "MISFET" and "MOSFET" are used interchangeably herein.

Although the overall fabrication method and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

Figure 1B:
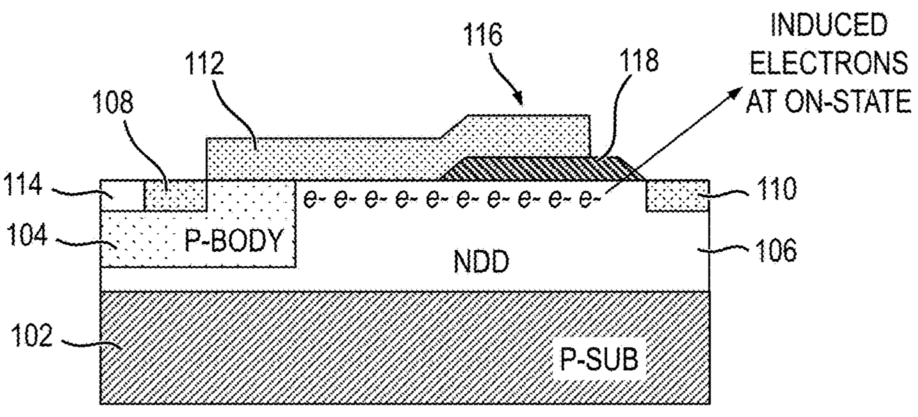
FIG. 1B is a cross-sectional view depicting at least a portion of the LDMOS device illustrated in FIG. 1A, taken along line A-A'.

FIGS. 1A and 1B are perspective and cross-sectional views, respectively, depicting at least a portion of an illustrative LDMOS device 100 incorporating a field plate structure therein; FIG. 1B is a cross-sectional view of the LDMOS device 100 shown in FIG. 1A taken along line A-A'. Specifically, the LDMOS device 100 includes a substrate 102 which may be formed of single-crystalline silicon. The substrate 102 is preferably modified by adding an impurity or dopant (e.g., boron, phosphorus, arsenic, etc.) to change a conductivity of the material (e.g., n-type or p-type). In this example, since the LDMOS device 100 is an n-channel transistor, the substrate 102 is of p-type conductivity and may thus be referred to as p-substrate (P-SUB).

A body region 104, which in this embodiment is of p-type conductivity (p-body), is formed proximate the upper surface of the substrate 102, extending laterally from a source side toward a drain side of the device. A lightly-doped drift (LDD) region 106 is formed proximate the upper surface of the substrate 102 and laterally adjacent to the body region 104. The LDD region 106 has a conductivity type that is opposite that of the body region 104, in this example, n-type conductivity, and is therefore referred to as an n-type drain drift (NDD) region.

The LDMOS transistor 100 includes a source region 108, a drain region 110 and a gate 112. The source and drain regions 108 and 110, respectively, are formed proximate an upper surface of the substrate 102 and spaced laterally from one another. The source and drain regions 108, 110 are preferably doped, such as by a conventional implant step, with an impurity of a known concentration level to selectively change the conductivity of the material as desired. In this example, the source and drain regions 108, 110 are of n-type conductivity.

The source region 108 is formed in at least a portion of the body region 104, and the drain region 110 is formed in at least a portion of the NDD region 106. A heavily-doped region 114 having a conductivity type the same as the body region 104 (i.e., p-type in this example) is formed proximate the upper surface of the substrate 102, laterally adjacent to the source region 108 and within the body region, to form a body contact of the LDMOS device 100. The source region 108 is electrically connected to the body contact 114.

The gate 112 is formed between the source and drain regions 108, 110 and above at least a portion of the body region 104. Although not explicitly shown, a thin oxide layer (e.g., silicon dioxide ($SiO_2$)), referred herein to as gate oxide, is formed under the gate 112 for electrically isolating the gate from the source and drain regions 108, 110 in the LDMOS device 100. As is well understood by those skilled in the art, a bias applied to the gate induces the formation of a channel in the body region 104 under the gate for controlling a current flow between the source region 108 and drain region 110.

As apparent from FIGS. 1A and 1B, the gate 112 is configured having a portion 116 that extends laterally over the NDD region 106 and ends before the drain region 110. This gate extension portion 116, which is formed on a dielectric layer 118 having a thickness that is greater compared to a thickness of the gate oxide, is typically referred to as a field plate. The field plate 116, which in this example is a continuous extension of the gate 112, functions to modulate an electric field in the LDMOS device 100 which increases the breakdown voltage of the device. The field plate 116 also induces electrons to collect proximate an upper surface of the NDD region 106 at an on-state of the LDMOS device 100, which reduces on-state resistance ($R_{DS\text{-}on}$).

As previously explained, LDMOS power transistors have dominated high-power applications over the past years, particularly power amplifier applications used, for example, in wireless communication systems. While it is well-known to employ a field plate structure in a MOSFET device to increase the breakdown voltage of the device through modulation of the electric field locally, the additional parasitic feedback capacitance introduced by standard field plate structures undesirably impacts the overall high-frequency performance of the device and renders the device essentially unsuitable for high-frequency applications without utilizing esoteric and costly materials and/or fabrication processes.

To meet the frequency performance criteria of modern high-frequency applications, it is desirable to reduce parasitic gate-to-drain capacitance, $C_{gd}$. In general, the capacitance, C, of a parallel plate capacitor is defined according to the following expression:

$$C = \varepsilon_0 \varepsilon_r \frac{A}{d},$$

where $\varepsilon_0$ is absolute permittivity (i.e., the permittivity of a vacuum $$\varepsilon_0 = 8.854 \times 10^{-12} F/m),$$

$\varepsilon_r$ is relative permittivity of the medium or dielectric material between the parallel plates, A is the surface area of a side of each of the parallel plates, and d is a distance between the plates (i.e., a thickness of the dielectric material between the plates). Thus, in order to reduce the capacitance, the thickness of the dielectric material between the plates can be increased and/or the surface area of one or both plates can be reduced.

In order to achieve enhanced high-frequency performance in an LDMOS device without significantly impacting power and linearity performance in the device, the present invention, as manifested in one or more embodiments thereof, provides an LDMOS device having a novel field plate structure configured to reduce overlap area between the gate and drain, thereby advantageously reducing parasitic gate-to-drain capacitance ($C_{gd}$) in the device.

Figure 2:
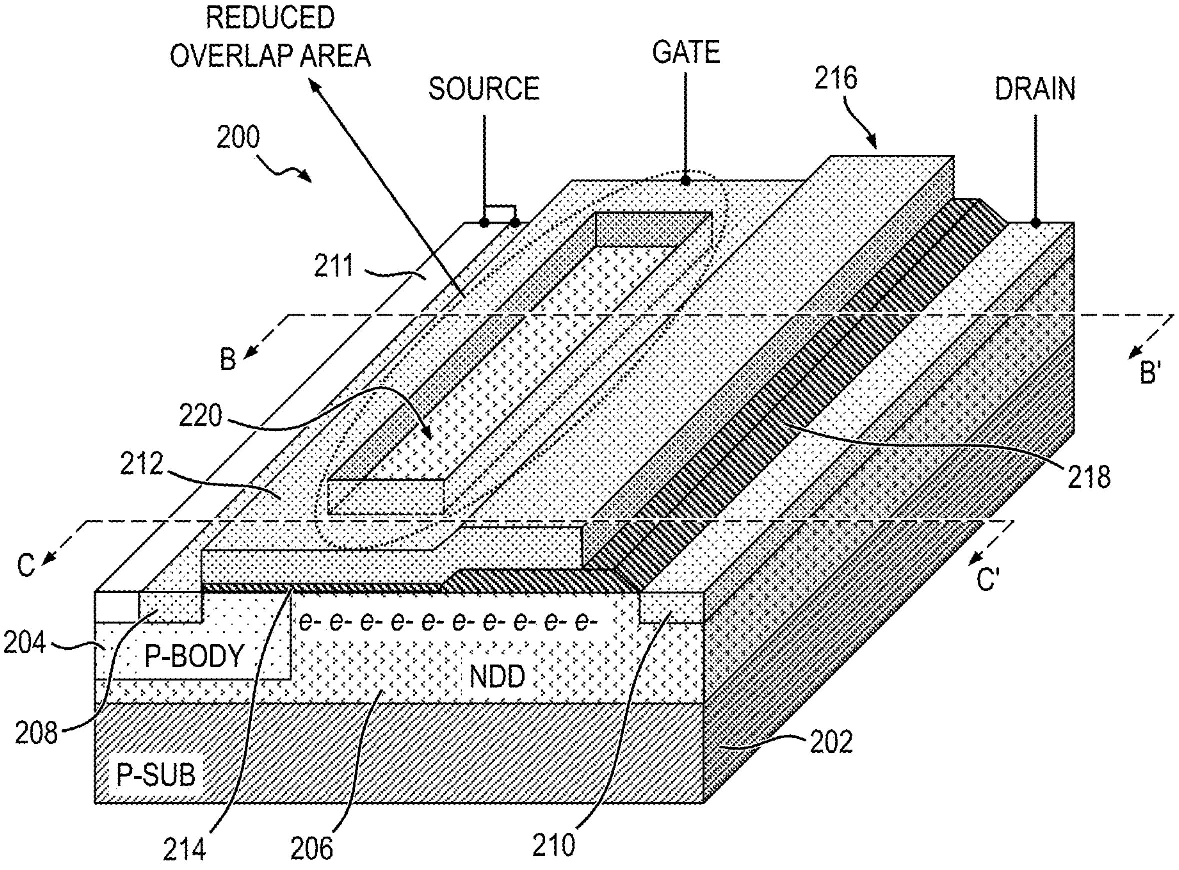
FIG. 2 is a perspective view depicting at least a portion of an exemplary LDMOS device including a field plate structure having reduced parasitic capacitance, according to an embodiment of the present invention.
Figure 3:
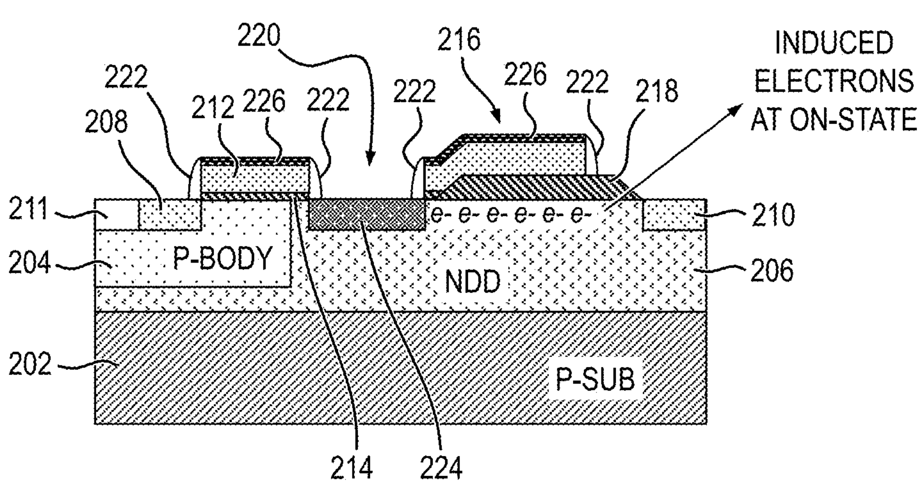
FIG. 3 is a cross-sectional view depicting at least a portion of the exemplary LDMOS device shown in FIG. 2, taken along line B-B', according to an embodiment of the present invention.
Figure 4:
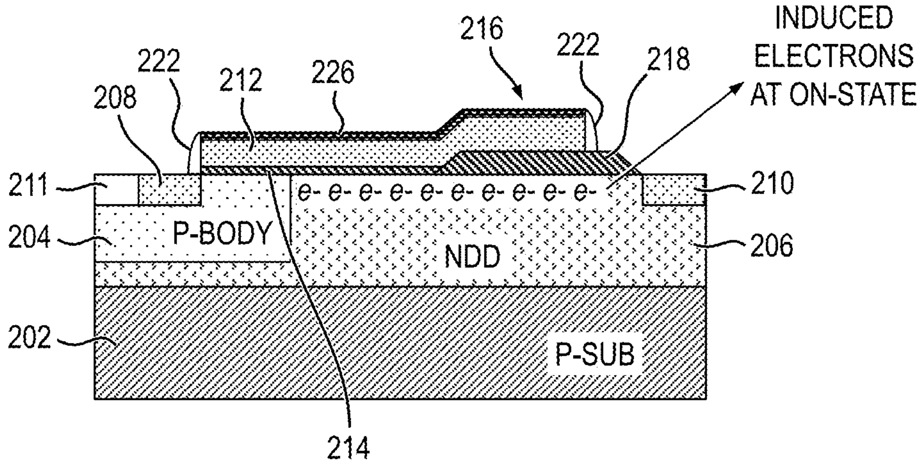
FIG. 4 is a cross-sectional view depicting at least a portion of the exemplary LDMOS device shown in FIG. 2, taken along line C-C', according to an embodiment of the present invention.

FIGS. 2-4 conceptually depict at least a portion of an exemplary LDMOS device 200 including a field plate structure having reduced parasitic capacitance, according to an embodiment of the invention; FIG. 2 is a perspective view depicting at least a portion of the exemplary LDMOS device 200, FIG. 3 is a cross-sectional view depicting at least a portion of the exemplary LDMOS device 200 taken along line B-B', and FIG. 4 is a cross-sectional view depicting at least a portion of the exemplary LDMOS device 200 taken along line C-C'. The LDMOS device 200 includes a semiconductor substrate 202. The substrate 202, in one or more embodiments, is formed of single-crystalline silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate 202 is preferably modified by adding an impurity or dopant (e.g., boron, phosphorus, arsenic, etc.) to change a conductivity of the material (e.g., n-type or p-type). In one or more embodiments, the substrate 202 is of p-type conductivity and may thus be referred to as p-substrate (P-SUB). A p-substrate may be formed by adding a p-type impurity or dopant (e.g., Group III elements, such as boron) of a prescribed concentration level (e.g., about $10^{14}$ to about $10^{18}$ atoms per cubic centimeter) to the substrate material, such as by using a diffusion or implant step, to change the conductivity of the material as desired. In one or more alternative embodiments, an n-substrate may be formed by adding an n-type impurity or dopant (e.g., Group V elements, such as phosphorus) of a prescribed concentration level to the substrate material.

A lightly-doped drain drift or drain extension region 206 is formed on at least a portion of the substrate 202, proximate the upper surface thereof. The drain drift region 206 has a conductivity type opposite the conductivity type of the substrate 202. In one or more embodiments, when using a p-substrate 202 the drain drift region 206 is of n-type conductivity, which may be formed by implanting an n-type impurity (e.g., phosphorus) into a defined area of the substrate using standard CMOS fabrication techniques, and is therefore referred to herein as an n-type drain drift (NDD) region. The doping concentration of the NDD region 206 is strongly correlated with the breakdown voltage of the LDMOS device 200, and thus by controlling the doping level of the NDD region 206, among other factors, a desired breakdown voltage can be achieved in the device.

A local low-resistivity body region 204 is formed in at least a portion of the NDD region 206. The body region 204 has a conductivity type that is opposite the conductivity type of the drain drift region 206. In one or more embodiments, the body region 204 comprises a p-type well (or p-well) disposed proximate an upper surface of the NDD region 206. The body region 204, in this exemplary embodiment, is formed by implanting a p-type impurity (e.g., boron) into a defined area of the NDD region 206 using standard CMOS fabrication techniques. The body region 204, although being of the same conductivity type as the substrate 202, is preferably more heavily doped relative to the doping level of the substrate, such that the body region has a lower resistivity than the substrate, such as, for example about 0.01 to 0.3 Ω-cm. In one or more alternative embodiments where an n-type substrate 202 is employed, the body region 204 may comprise an n-type well that is formed using similar CMOS fabrication techniques.

First and second heavily-doped regions having an opposite conductivity type/polarity (e.g., n-type) relative to the substrate 202 are formed proximate an upper surface of the LDMOS device 200 and define a source region 208 and drain region 210 of the LDMOS device; the source region is formed in the body region 204 and the drain region is formed in the NDD region. In one or more embodiments, the source and drain regions 208, 210 are comprised of heavily-doped n-type material formed using a standard CMOS implant process. Specifically, standard CMOS fabrication technology may implant the source region 208 and the drain region 210 with n-type material to form a first n+ region corresponding to the source region 208 and a second n+ region corresponding to the drain region 210. The n-type material includes impurity atoms of a donor type, such as, but not limited to, phosphorus, arsenic, antimony, or the like, that are capable of donating electrons. Implanting the source region 208 and/or the drain region 210 with the n-type material causes the carrier electron density in the source region 208 and/or the drain region 210 to exceed a carrier hole density.

A heavily-doped region 211 having a conductivity type the same as the body region 204 (i.e., p-type in this example), only having a higher dopant level than the body region, is formed in the body region, proximate the upper surface thereof and laterally adjacent to the source region 208, to form a body contact of the LDMOS device 200. The source region 208 is electrically connected to the body contact 211, for example during a subsequent metallization step.

With continued reference to FIGS. 2-4, a gate 212 is formed above the body region 204, proximate the upper surface of the wafer and between the source and drain regions 208, 210. The gate 212 is electrically isolated from the body region 204 and NDD region 206 by a thin insulating layer 214 disposed on the upper surface of the wafer on which the gate is formed. The thin insulating layer 214 may, in some embodiments, be formed of an oxide (e.g., silicon dioxide), and thus may be referred to herein as a gate oxide layer. The gate 212 is preferably formed of heavily-doped polysilicon, although other materials for forming the gate are similarly contemplated (e.g., a metal). As will be understood by those skilled in the art, when a bias voltage is applied between the gate 212 and source region 208, an inversion layer or channel is induced in the body region 204 under the gate oxide layer 214 via a field effect principle. The channel is operative to facilitate a flow of current between the source and drain regions 208, 210 of the LDMOS device 200, a magnitude of the current being controlled as a function of the applied voltage.

In the illustrative embodiment of FIGS. 2-4, the gate 212 includes a shielding structure 216 that is preferably formed as a homogeneous extension of the gate 212, extending laterally over at least a portion of the NDD region 206. The shielding structure 216, also referred to as a Faraday shield or field plate, is configured, in one or more embodiments, as a stepped structure having a first end disposed contiguous with the gate 212, and a second end extending laterally from the first end and disposed over the NDD region 206. The field plate (i.e., shielding structure) 216 is electrically isolated from the NDD region 206 by an insulating layer 218. The insulating layer 218, in one or more embodiments, is formed as an extension of the gate oxide layer 214, between the NDD region 206 and the field plate 216, and has a thickness that is greater relative to a thickness of the gate oxide layer. The field plate 216, being an extension of the gate 212 in this example, is formed of the same material as the gate (e.g., doped polysilicon), although other embodiments of the invention are similarly contemplated in which the gate and field plate are formed as separate structures of the same or different materials. The field plate 216 functions primarily to mitigate a locally high electric field that is often present at a gate edge on the drain side of the LDMOS device 200, which can result in electron injection (e.g., hot carrier injection (HCI)) into the gate oxide layer 214 leading to threshold drift which deteriorates linearity.

The field plate 216, according to aspects of the invention, is configured to reduce overlap area between the gate and drain, thereby advantageously reducing parasitic gate-to-drain capacitance in the device, as previously explained. Specifically, in one or more embodiments the field plate 216 is formed having at least one opening 220 therein exposing at least a portion of the underlying NDD region 206. This opening 220 in the field plate 216 is configured to reduce an amount of overlap area (i.e., the portion of the gate overlapping the NDD region), which beneficially reduces the gate-to-drain capacitance in the LDMOS device 200. The extent of the reduction in gate-to-drain capacitance will be a function of the dimensions of the opening 220. The gate-to-drain capacitance will be inversely proportional to the area of the opening 220; that is, the larger the area of the opening 220, the smaller the gate-to-drain capacitance.

Figure 5:
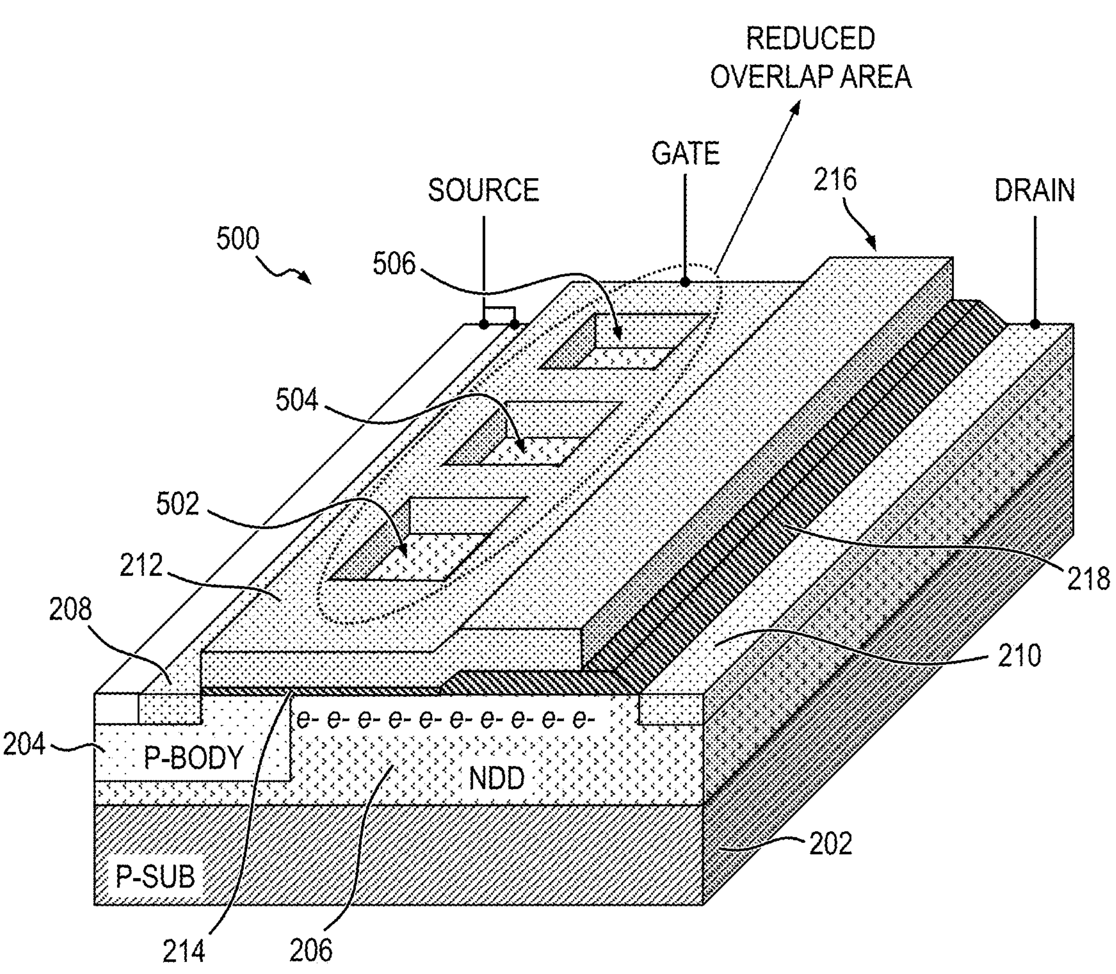
FIG. 5 a perspective view depicting at least a portion of an exemplary LDMOS device including a field plate structure having multiple openings formed therein, according to an embodiment of the present invention.

Although the opening 220 is depicted as being rectangular in shape, it is to be appreciated that embodiments of the invention are not limited to any specific shape or dimensions. For example, in one or more embodiments, the opening 220 may be substantially oval in shape. Furthermore, a field plate having multiple openings is similarly contemplated by embodiments of the invention. Specifically, with reference to the alternative embodiment shown in FIG. 5, the field plate 216 in LDMOS device 500 is configured having a plurality of openings 502, 504 and 506, overlying the NDD region 206. It is to be understood that embodiments of the invention are not limited to any specific number of openings, nor are embodiments limited to any specific shape and/or dimensions of each of the openings 502, 504, 506.

Although omitted in FIG. 2, dielectric spacers 222 are preferably formed on sidewalls of the gate 212 and field plate 216, as illustrated in FIGS. 3 and 4. The dielectric spacers 222 electrically isolate the gate 212 and field plate 216 from other elements of the LDMOS device 200. Optionally, with reference to FIG. 3, an implant layer 224 is formed in the NDD region 206, proximate the upper surface of the NDD region, underlying the opening 220 between the gate 212 and the field plate 216. In this illustrative embodiment, the implant layer 224 is doped with an n-type impurity of a prescribed concentration level (e.g., about $10^{15}$ to about $10^{18}$ atoms per cubic centimeter).

The implant layer 224 serves, at least in part, to increase the n-type concentration at the channel end closest to the drain region 210, thereby reducing the on-resistance, $R_{DS\text{-}on}$, along the current path between the source and drain regions. The implant layer 224 also serves to limit the channel region under the gate 212, effectively forming a self-aligned channel extension that enables the use of a shorter gate length and enhances stability. In high-frequency applications, smaller gate length equates to smaller gate charge ($Q_g$), which is desirable. When the gate length is reduced below a certain dimension (e.g., smaller than a p-body lateral diffusion length), the LDMOS device will be harder to turn on due to the p-type body region 204 extending beyond the gate 212. With the addition of the n-type implant layer 224, the p-type body region 204 that extends beyond the gate 212 will be anti-doped to n-type conductivity (in this exemplary embodiment), thereby making the LDMOS device 200 easier to turn on and less influenced by the unstable lateral diffusion of the body region 206.

In one or more embodiments, a layer of silicide 226, an alloy of metal and silicon, is formed on at least a portion of an upper surface of the gate 212 and field plate structure 216 to reduce a resistivity of the gate and field plate structure. Although not explicitly shown, a silicide layer may also be formed on at least a portion of an upper surface of the source region 208 and drain region 210 for forming low-resistance interconnections between the source region and a corresponding source contact, and between the drain region and a corresponding drain contact. The source and drain contacts (not explicitly shown, but implied) provide electrical connection with the source and drain regions 208, 210, respectively, of the LDMOS device 200.

Using standard CMOS fabrication steps, once the front-end processing used to form the LDMOS device 200 has been completed, the LDMOS device can be interconnected with one or more components fabricated on the same wafer to form a desired electrical circuit. This occurs in a series of wafer processing steps collectively referred to as back-end-of-line (BEOL) processing. BEOL processing primarily involves creating metal interconnects that are isolated by insulating (i.e., dielectric) layers. The insulating material used to form the dielectric layers has traditionally been a form of silicon dioxide ($SiO_2$), although other materials are similarly contemplated by embodiments of the invention (e.g., silicate glass, etc.).

Figure 6A:
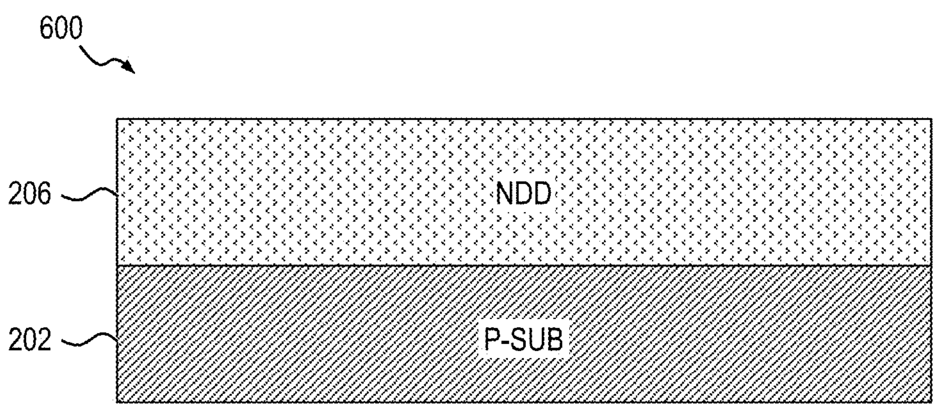
FIGS. 6A through 6E are cross-sectional views depicting at least a portion of exemplary processing steps in the fabrication of the exemplary LDMOS device shown in FIG. 3, according to an embodiment of the present invention.

By way of example only and without limitation, FIGS. 6A through 6E are cross-sectional views depicting at least a portion of exemplary intermediate processing steps 600 in the fabrication of the illustrative LDMOS device 200 shown in FIG. 3, according to an embodiment of the invention. With reference to FIG. 6A, the illustrative fabrication process 600 starts with a substrate 202, which in one or more embodiments comprises single-crystalline silicon or an alternative semiconductor material, such as, but not limited to, germanium, silicon germanium, silicon carbide, gallium arsenide, gallium nitride, or the like. In this illustrative embodiment, the substrate 202 is doped with a p-type impurity or dopant (e.g., boron, phosphorus, arsenic, etc.) to form a p-type conductivity substrate, or p-substrate (P-SUB). Embodiments of the invention are also contemplated in which an n-type conductivity substrate is employed. An NDD region 206 is formed on the upper surface of at least a portion of the substrate 202. The NDD region 206 is preferably formed, in one or more embodiments, using an implantation process, such as, for example, ion implantation.

Figure 6B:
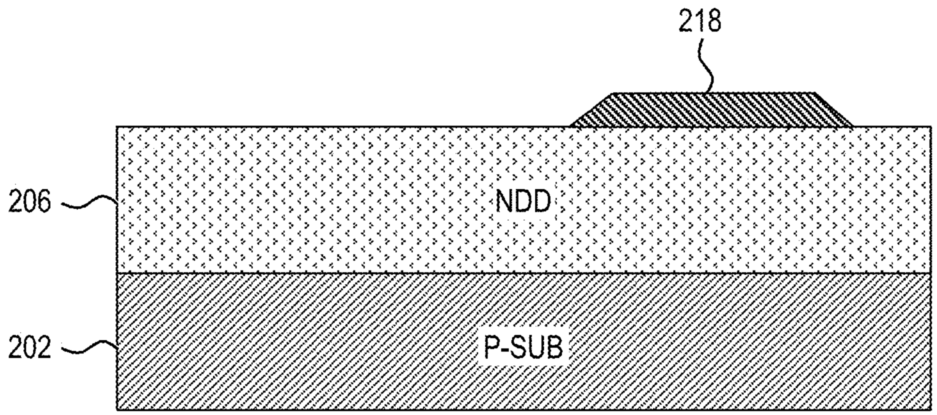

Referring now to FIG. 6B, a thick (high-voltage) insulating layer 218 is formed on at least a portion of the upper surface of the NDD region 206. In one or more embodiments, the insulating layer 218 comprises an oxide (e.g., silicon dioxide ($SiO_2$)) formed using a standard oxidation process, although the use of other suitable insulating materials is similarly contemplated. A deposition process may also be used to form the high-voltage insulating layer 218. The high-voltage insulting layer 218 is then patterned using standard photolithography and etching, with the resulting structure shown in FIG. 6B.

Figure 6C:
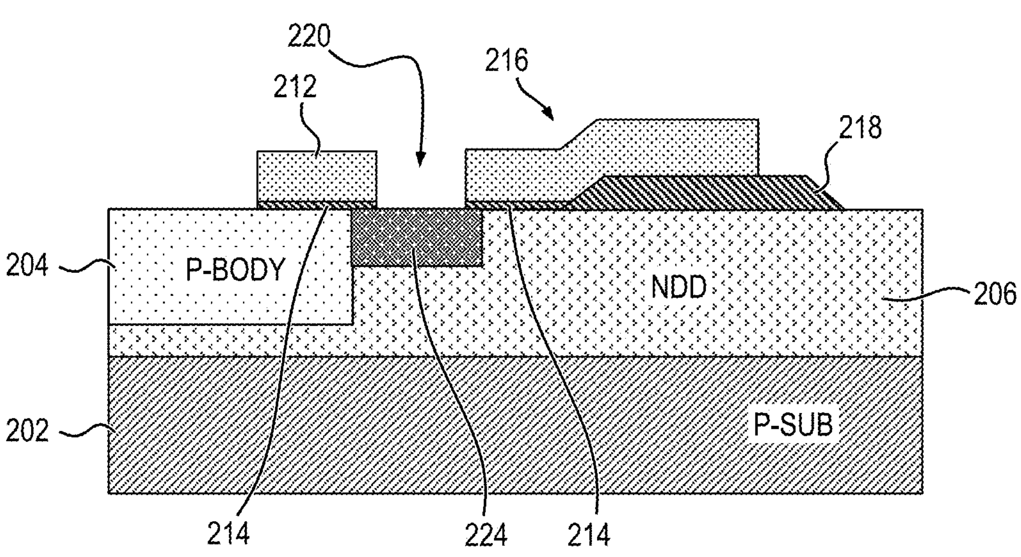

In FIG. 6C, a thin insulating (gate oxide) layer 214 is formed, such as by oxidizing the wafer. As previously stated, the gate oxide layer 214 has a thickness that is less than a thickness of the high-voltage insulating layer 218. The chemical reaction between oxygen and silicon to generate $SiO_2$ forming the high-voltage insulating layer 218 and gate oxide layer 214 is typically driven by a high-heat environment (e.g., about 800 degrees Celsius (° C.) to 1200° C.); however, even at room temperature, a shallow layer of native oxide (e.g., about 1 nanometer (nm) thick) can form in an air environment. In order to grow thicker oxides in a controlled environment, several known methods can be used, such as, for example, plasma-enhanced chemical vapor deposition (PECVD).

A layer of polysilicon is then deposited on at least a portion of the upper surface of the wafer, particularly over the high-voltage insulating layer 218 and gate oxide layer 214. The polysilicon layer, after patterning and etching, will form the gate 212 and field plate 216 structures of the LDMOS device 200. As previously described, the field plate 216, which in this exemplary embodiment is essentially an extension of the gate 212, is configured having at least one opening 220 therein which serves to reduce the parasitic gate-to-drain overlap capacitance $C_{gd}$.

With continued reference to FIG. 6C, a doped body region 204 is formed in a portion of the NDD region 206, proximate the upper surface of the NDD region. In this example, the body region 204 is doped with an impurity having a conductivity type opposite to the conductivity type of the NDD region (i.e., a p-type impurity), and thereby forms a p-body of the LDMOS device 200. The body region 204 is preferably formed using an implant process, such as, for example, ion implantation, often followed by annealing at a prescribed temperature to drive and distribute the impurity in the NDD region 206. An inversion layer or channel is established in the body region 204 under the gate oxide layer 214 of the LDMOS device 200 upon application of a prescribed bias voltage (e.g., at least equal to a threshold voltage, $V_t$, of the LDMOS device) between a gate and source region (212 and 208, respectively, in FIG. 2). The channel is operative to facilitate a flow of current between the source and drain regions in the LDMOS device 200 as a function of the applied bias voltage.

Optionally, an implant layer 224 is formed in the NDD region 206, proximate the upper surface of the NDD region, underlying the opening 220 between the gate 212 and the field plate 216. During implantation, the gate 212 and field plate 216 are preferably used as a mask. As previously explained, the implant layer 224, which in this exemplary embodiment is an n-type implant layer, serves to increase the n-type doping concentration level at the edge of the channel closest to the drain region 210, thereby reducing the on-resistance of the LDMOS device. The implant layer 224 also serves to limit the channel region under the gate 212 for improved high-frequency performance.

Figure 6D:
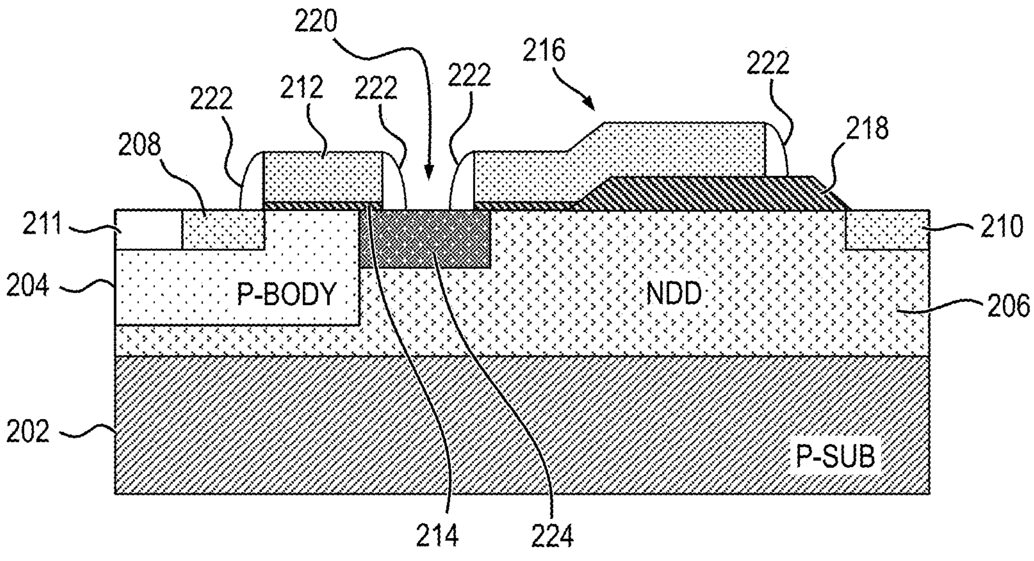

In FIG. 6D, insulating spacers 222 are formed on sidewalls of the gate 212 and field plate 216. Additionally, a source region 208 and drain region 210 are formed, such as by using an implant process (e.g., ion implantation) to introduce impurities of a prescribed concentration level and type, followed by a diffusion step to facilitate distribution of the dopant. The source and drain regions 208, 210 are preferably formed proximate the upper surface of the body region 204 and NDD region 206, respectively, and are spaced laterally from one another. A heavily-doped region 211, which is preferably of p-type conductivity in this example and serves as a body contact, is formed adjacent to the source region 208 using an implantation process.

Figure 6E:
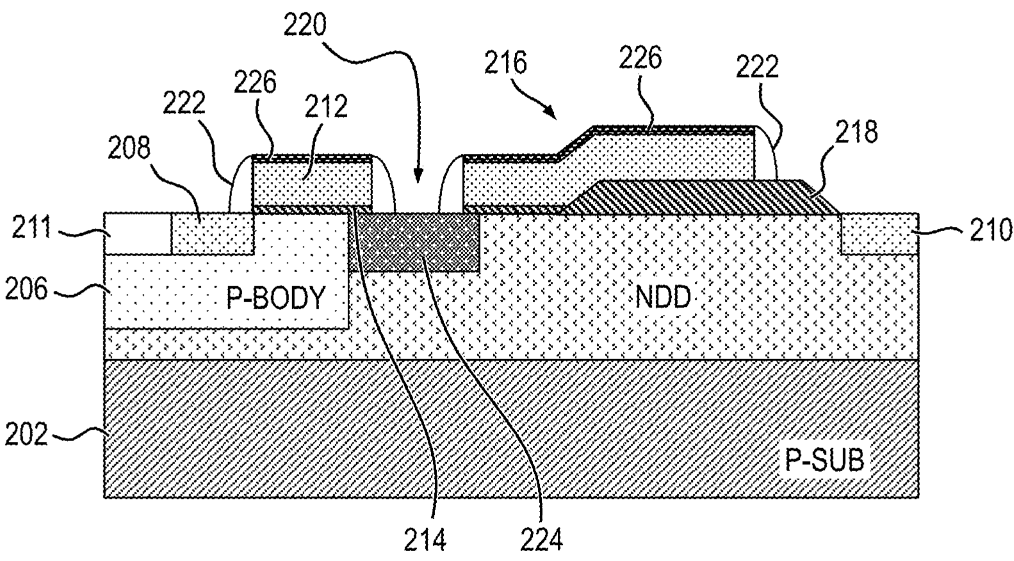

Referring now to FIG. 6E, a layer of silicide 226 is formed on the upper surfaces of the gate 212 and field plate 216 to thereby reduce the resistance of these structures. As will be known by those skilled in the art, a silicide is typically formed by depositing a metal on the upper surface of a silicon structure, followed by a high-temperature anneal (e.g., about 900 degrees Celsius) which converts the deposited metal into the silicide layer. Silicide layers 226 are only formed in those areas in which the deposited metal (which after annealing becomes a metal component of the silicide) is in direct contact with silicon, and thus the process is self-aligned. After silicide formation is complete, BEOL processing is preferably performed for interconnecting individual devices (e.g., transistors, capacitors, resistors, etc.) with wiring on the wafer, the metallization layer, as will be known by those skilled in the art.

Figure 7A:
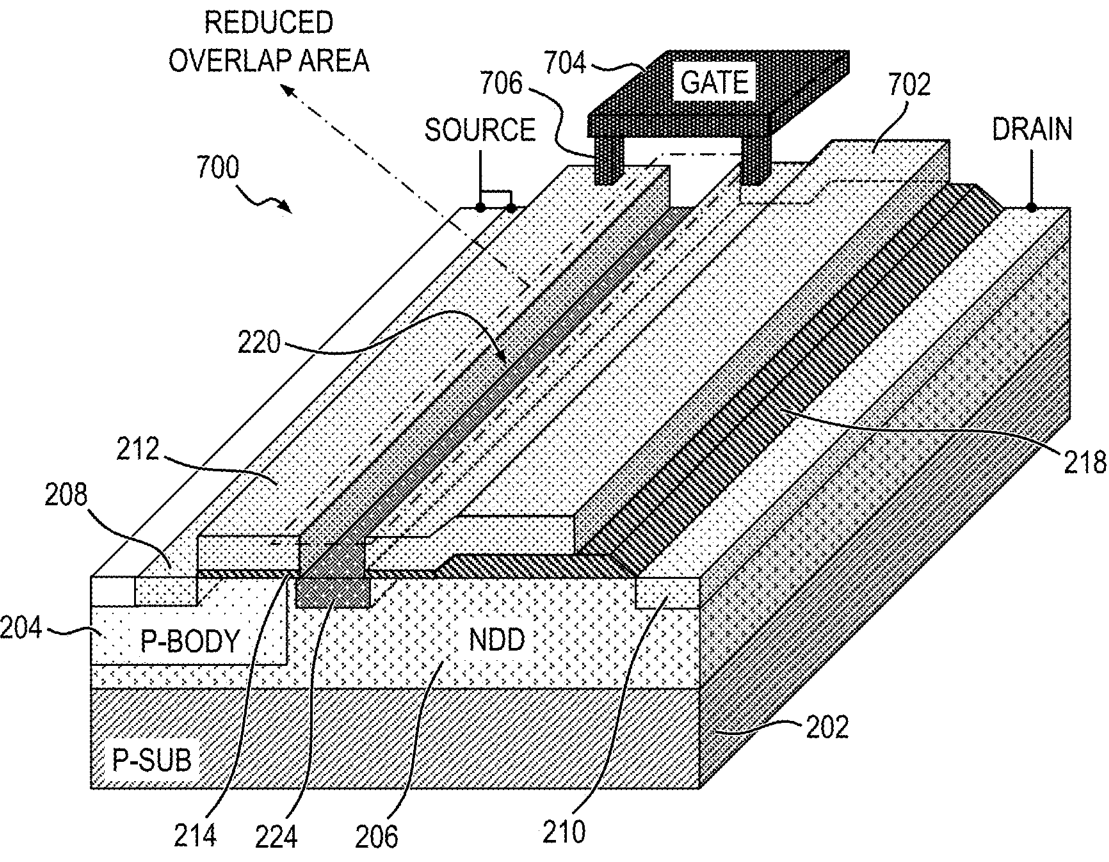
FIG. 7A is a perspective view depicting at least a portion of an exemplary LDMOS device including a field plate formed as a separate structure from the gate, according to an embodiment of the present invention.

FIG. 7A is a perspective view depicting at least a portion of an exemplary LDMOS device 700 including an enhanced field plate structure, according to an alternative embodiment of the invention. Specifically, the LDMOS device 700 is configured in a manner consistent with the illustrative LDMOS device 200 shown in FIG. 2, except that rather than having a field plate (216 in FIG. 2) formed as an extension of the gate 212, the LDMOS device 700 includes a shielding structure 702 that is formed as a separate structure from the gate 212. Compared with the field plate configuration shown in FIG. 2, the separation of the shielding structure 702 from the gate 212 further reduces parasitic gate-to-drain capacitance in the LDMOS device 700. Furthermore, with the shielding structure 702 configured as a separate structure from the gate 212, the shielding structure need not be formed of the same material as the gate.

In this exemplary embodiment, the shielding structure 702 is electrically connected to the gate 212 by way of a gate electrode 704 and corresponding conductive vias 706. The conductive vias 706 are configured to provide direct electrical connection between the gate electrode 704 and respective ends of the gate 212 and shielding structure 702. In one or more embodiments, the ends of the gate 212 and shielding structure 702 distal to the conductive vias 706 are left electrically open (i.e., unconnected). Moreover, the conductive vias 706 are adapted to vertically separate the gate electrode 704 from the NDD region 206, thereby further reducing parasitic gate-to-drain capacitance. The gate electrode 704 and conductive vias 706 may be formed of metal (e.g., aluminum gate electrode and tungsten vias), although embodiments of the invention are not limited to any specific conductive material. Furthermore, the gate electrode 704 and conductive vias 706 need not be formed of the same material.

Preferably, in one or more embodiments, the gate electrode 704 and/or conductive vias 706 are formed of a high-impedance material. Forming the gate electrode 704 and/or the conductive vias 706 of a high-impedance material minimizes drain electrode voltage spikes coupled onto the gate 212 at high switching frequencies, and thereby helps reduce the likelihood of shoot-through as a result of false gate turn-on, which can often occur in a high-frequency power switching application.

In this embodiment, the gate and shielding structure are configured as parallel independent fingered structures. Since the shielding structure 702 is only electrically connected with the gate 212, through the gate electrode 704 and conductive vias 706, at the ends of the gate and shielding structure fingers, the amount of electrical coupling of the gate on the NDD region 206, and hence the parasitic gate-to-drain capacitance, is significantly reduced.

Figure 7B:
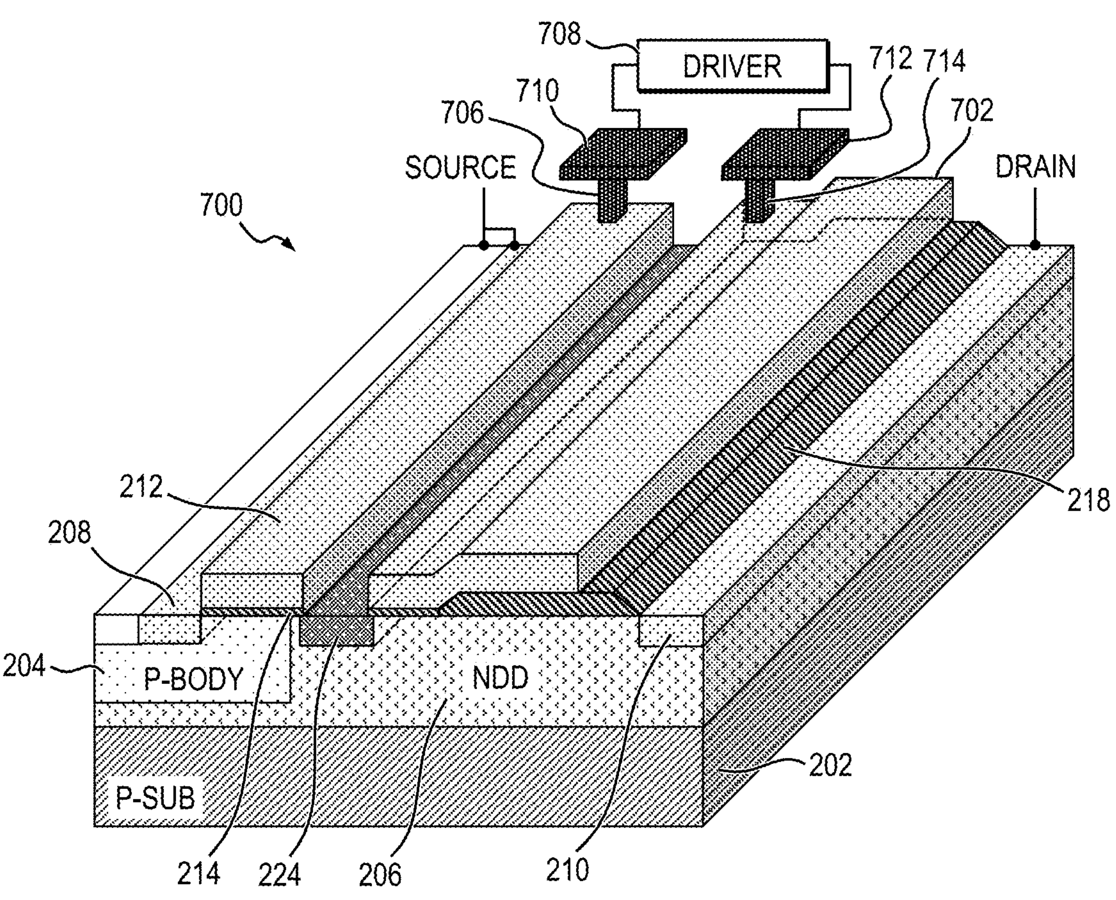
FIG. 7B is a perspective view depicting the exemplary LDMOS device shown in FIG. 7A including a connection to an external gate driver circuit, according to an embodiment of the present invention.

In an alternative embodiment, the gate 212 and shielding structure 702 are electrically connected together through an external circuit. Specifically, FIG. 7B is a perspective view depicting the exemplary LDMOS device 700 shown in FIG. 7A including a connection with an external gate driver circuit 708, according to an embodiment of the invention. In this exemplary embodiment, the gate electrode (704 in FIG. 7A) is split into a gate electrode 710 and a shielding structure electrode 712 which are physically and electrically separated from one another. The gate electrode 708, like the gate electrode 704 depicted in FIG. 7A, is electrically connected with the gate 212 through a corresponding conductive via 706. Similarly, the shielding structure electrode 712 is electrically connected with the shielding structure 702 through its corresponding conductive via 714.

With continued referenced to FIG. 7B, an external gate driver circuit 708 is coupled between the gate electrode 710 and the shielding structure electrode 712. In one or more embodiments, in addition to supplying control signals for independently driving the gate 212 and shielding structure 702, the gate driver circuit 708 provides a high-impedance (e.g., about 1000 ohms) electrical connection between the gate 212 and the shielding structure 702. As previously stated, one benefit of this high-impedance connection arrangement is to minimize drain voltage spikes that may be coupled onto the gate 212 at high switching frequencies leading to false gate turn-on, which helps reduce the likelihood of shoot-through; that is, the shorting of the high voltage supply to ground through high-side and low-side MOSFETs when both devices are on.

Figure 8:
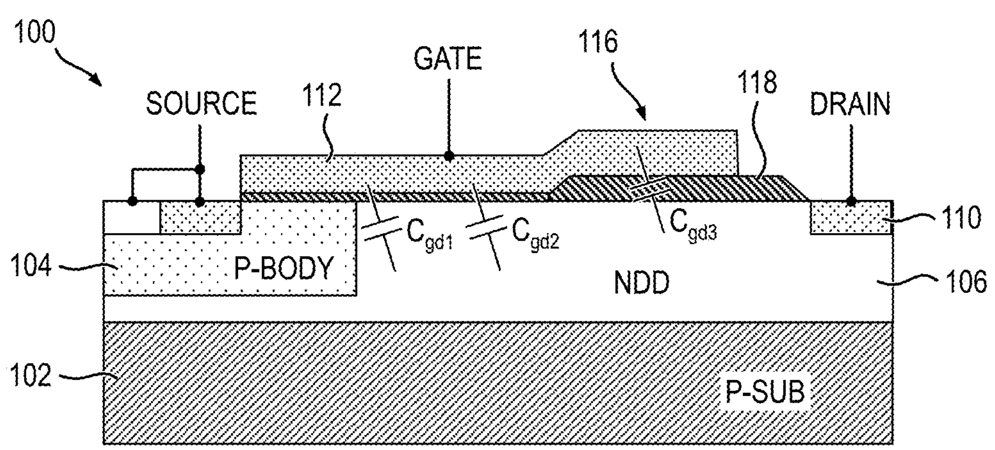
FIG. 8 is a cross-sectional view of the illustrative LDMOS device shown in FIG. 1A, conceptually depicting certain parasitic capacitance components associated therewith.
Figure 9:
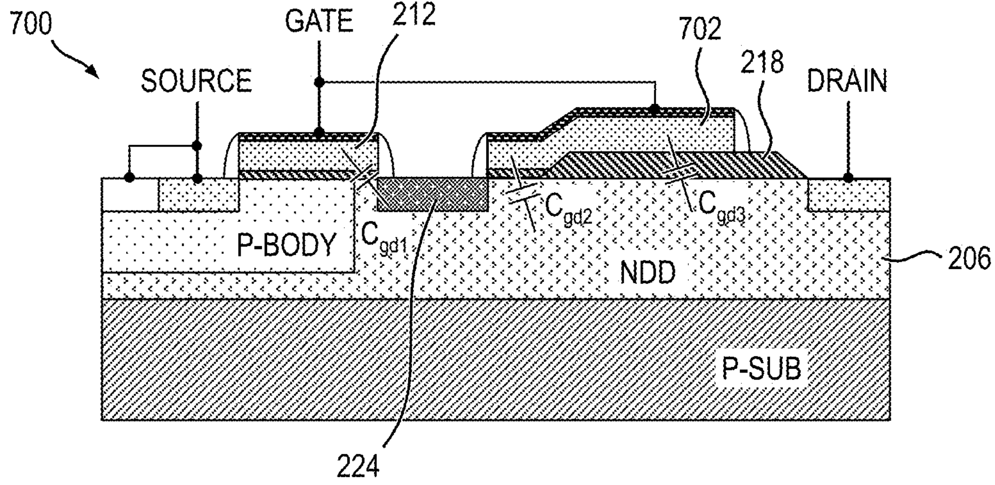
FIG. 9 is a cross-sectional view of the illustrative LDMOS device shown in FIG. 7A, conceptually depicting certain parasitic capacitance components associated therewith.

FIG. 8 is a cross-sectional view of the illustrative LDMOS device 100 shown in FIG. 1A, conceptually depicting parasitic capacitance components associated with the gate 112 and field plate 116. By way of comparison only, FIG. 9 is a cross-sectional view of the illustrative LDMOS device 700 shown in FIG. 7A, conceptually depicting parasitic capacitance components associated with the gate 212 and shielding structure 702.

More particularly, with reference to FIG. 8, the LDMOS device 100 includes parasitic gate-to-drain capacitance components $C_{gd1}$, $C_{gd2}$ and $C_{gd3}$ introduced as a result of the extension of the gate 112 and field plate 116 over the NDD region 106. The capacitance of $C_{gd3}$ will be less than $C_{gd2}$ due, at least in part, to the thicker dielectric layer 118 on which the field plate 116 is formed. The distributed parallel capacitance components $C_{gd1}$, $C_{gd2}$ and $C_{gd3}$ will be summed together to contribute to the total gate-to-drain capacitance in the LDMOS device 100. By comparison, with the novel configuration of the shielding structure 702 shown in FIG. 9, the components of parasitic gate-to-drain capacitance present in the LDMOS device 700 is $C_{gd1}$, attributable to the slight electrical coupling of an edge of the gate 212 on the NDD region 206, $C_{gd2}$, attributable to the slight overlap of an edge of the shielding structure 702 on the NDD region, and $C_{gd3}$, attributable to the extension of the shielding structure over the NDD region. However, since a large portion of the gate extension over the NDD region has been removed in the LDMOS device 700, these parasitic gate-to-drain capacitance contributions will be significantly smaller in the LDMOS device 700 compared to corresponding parasitic capacitance components in the LDMOS device 100 of FIG. 1A. Moreover, given that gate-to-drain capacitance is a primary source of switching induced gate false turn on in an LDMOS device, the LDMOS device 700 will beneficially achieve enhanced device reliability at higher switching frequencies compared to the LDMOS device 100.

In order to reduce the parasitic capacitance introduced by the extension of the field plate 216 (see FIG. 2) over the NDD region 206, the thickness of the insulating layer 218 between the field plate (i.e., shielding structure 702 in FIGS. 7A and 7B) and the NDD region is increased, as previously described. The insulting layer 218 shown in FIGS. 2-7B is preferably formed using an oxidation process or an oxide deposition process, in embodiments of the invention. To be more compatible with current semiconductor process platforms, FIGS. 10 and 11 illustrate alternative embodiments for forming the high-voltage insulating layer underlying the field plate 216.

Figure 10:
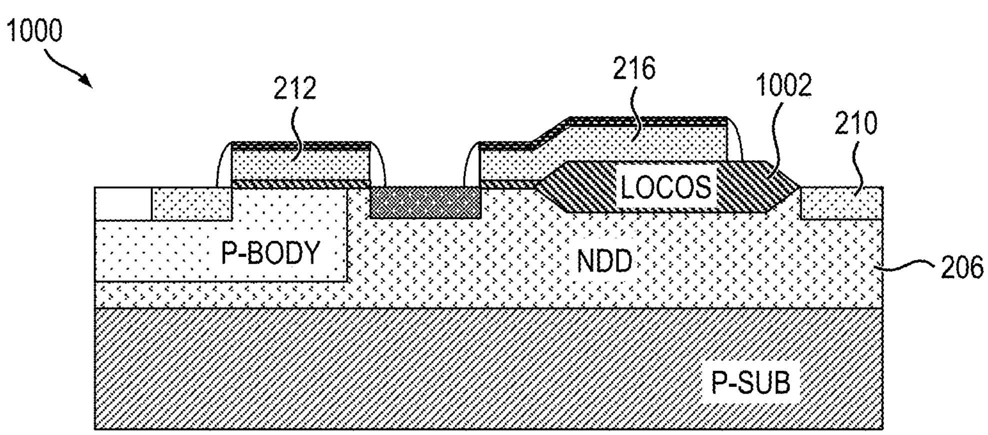
FIG. 10 is a cross-sectional view depicting at least a portion of an exemplary LDMOS device consistent with the illustrative LDMOS devices shown in FIGS. 2-7B, with the thick insulating layer replaced by a local oxidation of silicon (LOCOS) structure, according to an embodiment of the present invention.

Specifically, FIG. 10 is a cross-sectional view depicting at least a portion of an exemplary LDMOS device 1000 formed in a manner consistent with the illustrative LDMOS devices shown in FIGS. 2-7B, with the high-voltage insulating layer (218 in FIGS. 2, 7A and 7B) replaced by a local oxidation of silicon (LOCOS) structure 1002, according to an embodiment of the invention. As will be known by those skilled in the art, during LOCOS processing, areas of the wafer not meant to be oxidized are coated in a material (e.g., silicon nitride) that prevents diffusion of oxygen at high temperatures (e.g., about 800 to 1200° C.). The LOCOS structure 1002 is formed, in one or more embodiments, by thermal oxidation of silicon in the NDD region 206. During this high-temperature process, the silicon wafer is "consumed" and "replaced" by silicon oxide. The field plate 216 is then formed on at least a portion of the LOCOS structure 1002 in a manner consistent with the formation of the field plate 216 on the high-voltage insulating layer 218 shown in FIG. 2.

Figure 11:
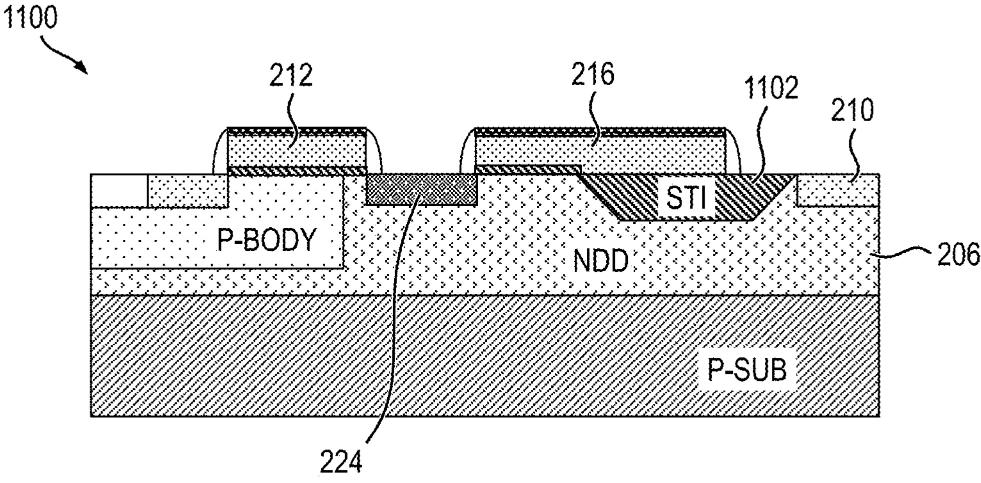
FIG. 11 is a cross-sectional view depicting at least a portion of an exemplary LDMOS device consistent with the illustrative LDMOS devices shown in FIGS. 2-7, only with the thick insulating layer replaced by a shallow trench isolation (STI) structure, according to an embodiment of the present invention.

Similarly, FIG. 11 is a cross-sectional view depicting at least a portion of an exemplary LDMOS device 1100 formed in a manner consistent with the illustrative LDMOS devices shown in FIGS. 2-7B, with the high-voltage insulating layer (218 in FIGS. 2, 7A and 7B) replaced by a shallow trench isolation (STI) structure 1102, according to an embodiment of the invention. As will be known by those skilled in the art, an STI structure 1102 is created early during the semiconductor device fabrication process, before transistors and other active components are formed. In one or more embodiments, the STI structure 1102 is formed by etching a trench in a portion of the NDD region 206 (between the implant layer 224 and the drain region 210), depositing one or more dielectric materials (e.g., silicon dioxide) to fill the trenches, and removing the excess dielectric material using a planarization technique such as, for example, CMP. The field plate 216 is then formed on at least a portion of the STI structure 1102 in a manner consistent with the formation of the field plate 216 on the high-voltage insulating layer 218 shown in FIG. 2; however, because the STI structure 1102 is substantially planar with the upper surface of the wafer, the field plate 216 will be formed over the NDD region 206 such that it is substantially planar with the gate 212; that is, the field plate will not be a stepped structure like the field plate shown in FIG. 2, 7A or 7.

Figure 12:
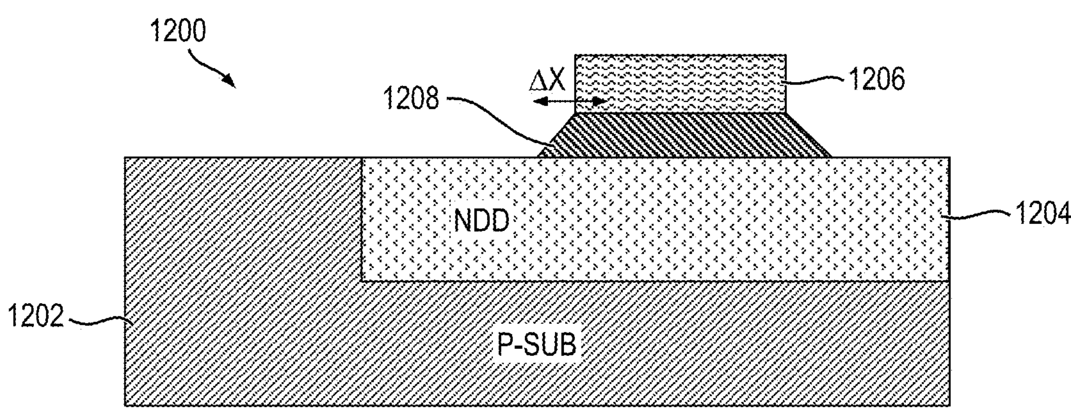
FIG. 12 is a cross-sectional view conceptually depicting an intermediate step in the fabrication of an exemplary LDMOS device which is consistent with the illustrative device shown in FIGS. 1A and 1B.

FIG. 12 is a cross-sectional view conceptually depicting an intermediate step in the fabrication of an exemplary LDMOS device 1200, which is consistent with the illustrative device 100 shown in FIGS. 1A and 1B. The LDMOS device 1200 includes a substrate 1202, which is preferably of p-type conductivity (P-SUB) in this example, and a doped drain region 1204, which is preferably an n-type drain drift (NDD) region in this example, formed in the substrate proximate an upper surface of the substrate. In forming the LDMOS device 1200, a lithographic patterning process is preferably used to define a layer of photoresist 1206 disposed on an upper surface of an oxide layer formed over the wafer. After etching, a thick oxide structure 1208 will remain under the patterned photoresist layer 1206. It is to be appreciated that the thick oxide structure 1208 may comprise an insulating material or materials other than an oxide. The thick oxide structure 1208 is used to block a drain silicide and sustain the drain voltage in the LDMOS device 1200.

Figure 13:
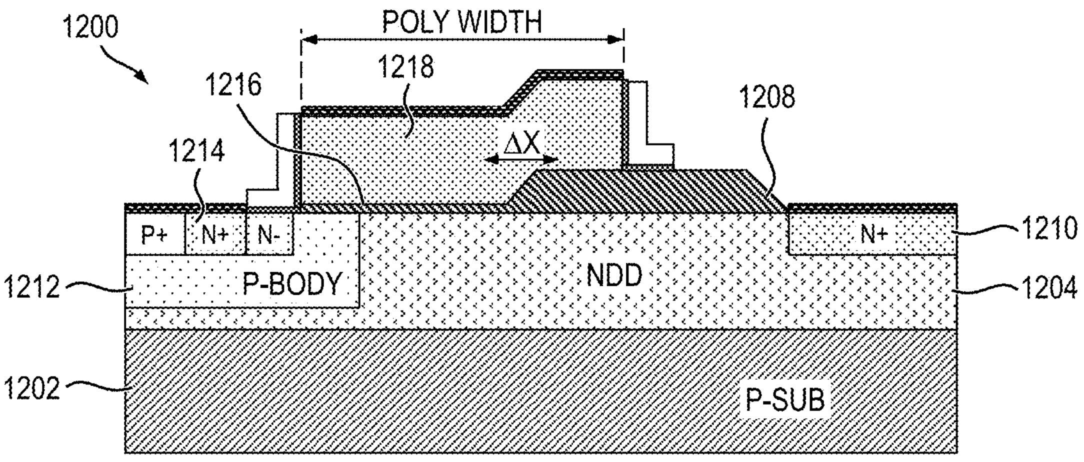
FIG. 13 is a cross-sectional view conceptually depicting the illustrative LDMOS device shown in FIG. 12 after subsequent fabrication steps have been performed.

With reference now to FIG. 13, the LDMOS device 1200 is depicted after subsequent fabrication steps have been performed. More particularly, the LDMOS device 1200 further includes a drain region 1210, which in one or more embodiments is of n-type conductivity (N+), formed in the NDD region 1204 proximate the upper surface of the NDD region. A body region 1212 is formed in the NDD region 1204 (or adjacent to the NDD region, in some embodiments) proximate the upper surface of the NDD region, extending laterally from a source side toward a drain side of the LDMOS device 1200. The body region 1212 has a conductivity type that is opposite in polarity to that of the NDD region 1204, in this example, p-type conductivity (P-BODY).

The LDMOS device 1200 includes a source region 1214 formed proximate an upper surface of the body region 1212 and spaced laterally from the drain region 1210. The source and drain regions 1214, 1210 are preferably doped, such as by a conventional implant step, with an impurity of a known concentration level to selectively change the conductivity of the material as desired. In this example, the source and drain regions 1214, 1210 are of n-type conductivity, although embodiments of the invention are not limited to n-type conductivity.

A thin oxide layer 1216 is formed on upper surfaces of at least a portion of the body region 1212 and NDD region 1204. The thin oxide layer 1216 serves to prevent direct electrical connection between a gate 1218 and the NDD and body regions 1204, 1212 of the LDMOS device 1200. The gate 1218 is formed on an upper surface of the thin oxide layer 1216 and at least a portion of the thick oxide structure 1208, in this illustrative embodiment. In one or more embodiments, the gate 1218 comprises polysilicon material which may or may not be silicided.

Figure 14:
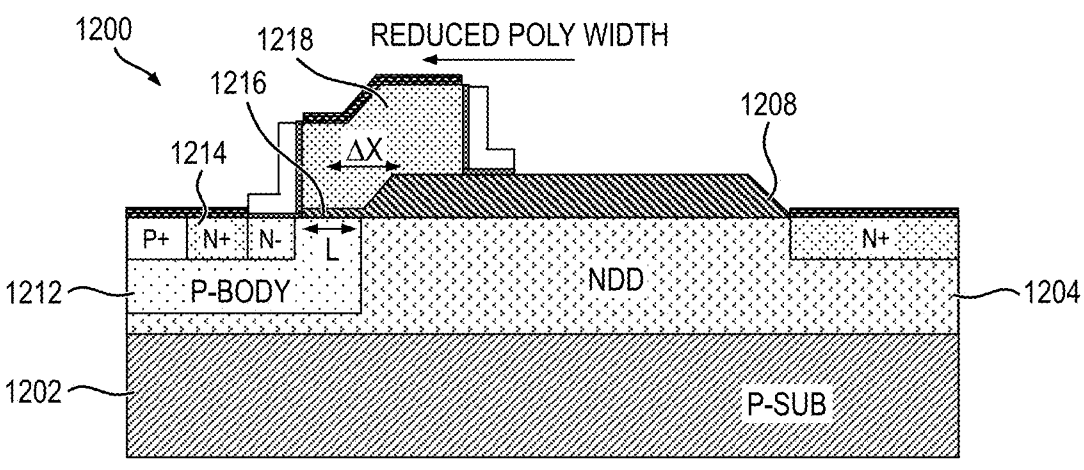
FIG. 14 is a cross-sectional view conceptually depicting the illustrative LDMOS device shown in FIGS. 12 and 13, after reducing a width of the gate.

A gate charge, $Q_g$, associated with the gate 1218 is proportional to a width of the polysilicon gate. For applications in which it is desirable to reduce gate charge, such as in most high-frequency and/or high-speed applications, the width of the polysilicon gate 1218 is preferably reduced (i.e., scaled back), as conceptually shown in FIG. 14. When the width of the gate 1218 is reduced too much, a length, L, of the gate on the thin oxide layer 1216, above a channel in the body region 1212, becomes very small. Due to variations inherent in the lithography process, among other factors, there will be a variation, $\Delta X$, in the position of a boundary of the thick oxide structure 1208. This thick oxide boundary variation $\Delta X$ remains substantially constant and independent of the gate width reduction, and therefore as the gate length L becomes small, a variation ratio, $\Delta X/L$, becomes unacceptably large, thereby resulting in an unstable LDMOS device. To ensure that the variation ratio $\Delta X/L$ does not exceed a prescribed threshold value, process guard bands are typically assigned restricting how close the thick oxide boundary can be to the device channel. These guard bands, however, limit the amount by which the gate width can be reduced, thereby undesirably constraining the high-frequency performance of the LDMOS device.

Figure 15:
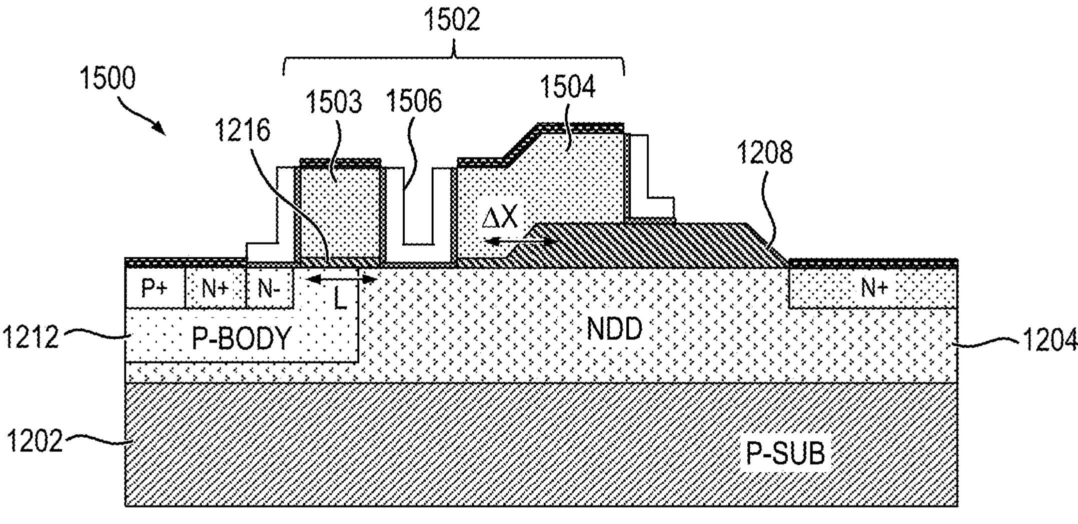
FIG. 15 is a cross-sectional view depicting at least a portion of an exemplary LDMOS device including a gate separated into control gate and field plate portions, consistent with the illustrative LDMOS device shown in FIG. 3, according to one or more embodiments of the present invention.

In accordance with one or more embodiments of the invention, the polysilicon gate 1218 is separated into a control gate portion and a field plate portion which are spaced apart laterally from one another. FIG. 15 is a cross-sectional view depicting at least a portion of an exemplary LDMOS device 1500 including a gate 1502 separated into control gate and field plate portions, according to one or more embodiments of the invention. More particularly, in the LDMOS device 1500, the gate 1502 is separated into a control gate 1503 formed on the thin oxide layer 1216, and a field plate 1504 formed on at least a portion of the thick oxide structure 1208. The control gate 1503 and field plate 1504 are spaced apart laterally and electrically isolated from one another by an isolation structure 1506 formed above the NDD region 1204 between the control gate and field plate. Arranged in this manner, the control gate 1503 will not be impacted by the thick oxide boundary variation $\Delta X$. Furthermore, the control gate 1503 can be fully silicided for beneficially providing a reduced and stable gate charge $Q_g$.

Figure 16:
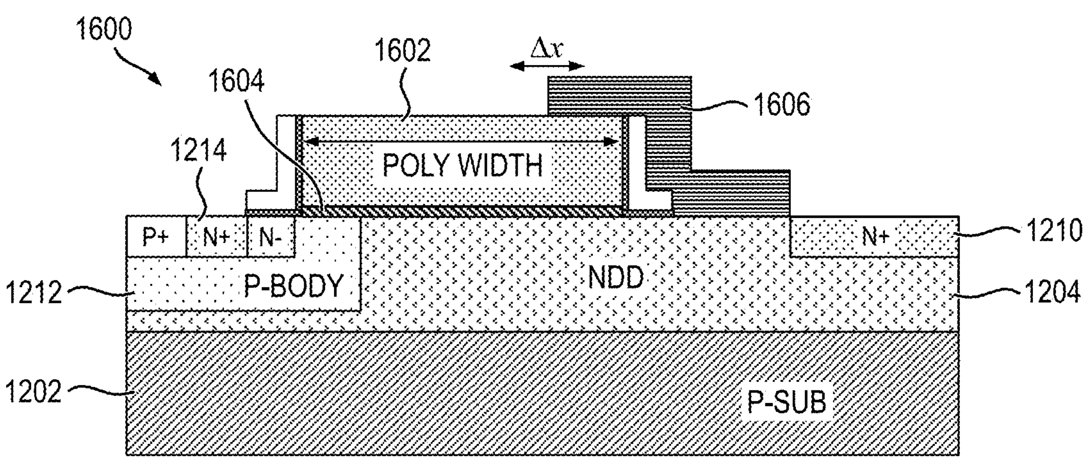
FIG. 16 is a cross-sectional view depicting an intermediate step in the fabrication of an exemplary LDMOS device formed in a manner similar to the illustrative LDMOS device shown in FIG. 13, but without the thick oxide structure, according to one or more embodiments of the present invention.

FIG. 16 is a cross-sectional view depicting an intermediate step in the fabrication of an exemplary LDMOS device 1600 formed in a manner similar to the illustrative LDMOS device 1200 shown in FIG. 13, but without the thick oxide structure, according to one or more embodiments of the invention. With reference to FIG. 16, the LDMOS device 1600 includes a gate 1602, preferably a polysilicon gate, formed on a thin insulating layer 1604, which may comprise an oxide (e.g., silicon dioxide), disposed on an upper surface of at least a portion of the NDD region 1204 and body region 1212. The gate 1602 may optionally be bounded on either end by insulating sidewall spacers as shown.

Using lithographic patterning and etching, an oxide structure 1606 is formed on at least a portion of an upper surface of the gate 1602 and the NDD region 1204, leaving exposed the drain region 1210 and a portion of the gate for subsequent silicidation. Thus, the oxide structure 1606 serves, at least in part, to block the drain silicide over the NDD region 1204. As was the case for the thick oxide structure 1208 shown in FIGS. 12 and 13, due to variations inherent in the lithography process, among other factors, there will be a variation, $\Delta x$, in the position of an edge boundary of the oxide structure 1606. This oxide boundary variation $\Delta x$ remains substantially constant and independent of the polysilicon gate width.

Figure 17:
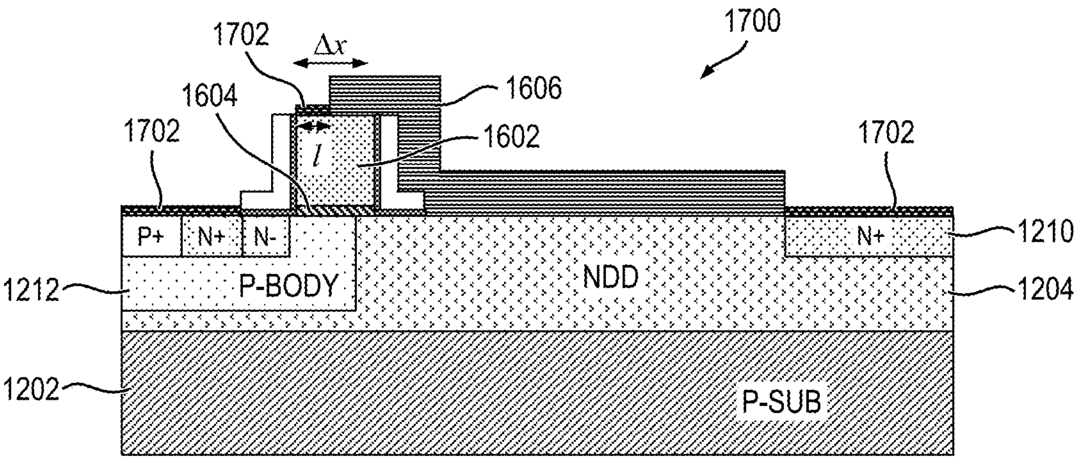
FIG. 17 is a cross-sectional view depicting at least a portion of the illustrative LDMOS device shown in FIG. 16 after silicidation has been performed, according to one or more embodiments of the present invention.

FIG. 17 is a cross-sectional view depicting at least a portion of the illustrative LDMOS device 1600 shown in FIG. 16 after silicidation has been performed, according to one or more embodiments of the invention. In this embodiment, the width of the polysilicon gate 1602 is scaled back to thereby reduce gate charge $Q_g$. An overlap of the oxide structure 1606 on the upper surface of the gate 1602 is substantially the same after the gate width reduction, which leaves only a very small gate silicide length, l, on the upper surface of the gate, which is undesirable. Furthermore, similar to the gate length variation ratio ΔX/L previously described, the LDMOS device 1600 will experience an unacceptably large gate silicide length variation ratio, Δx/l, since the boundary variation Δx remains substantially constant and will become a primary factor in the variation ratio as silicide length/shrinks. This will make the gate resistance, $R_g$, of the LDMOS device 1600 too unstable for practical use. To ensure that the variation ratio Δx/l does not exceed a prescribed threshold value, guard bands are placed on how close the edge of the oxide structure 1606 can be to an opposing edge of the gate 1602. These guard bands undesirably limit the amount by which the gate width can be reduced.

Figure 18:
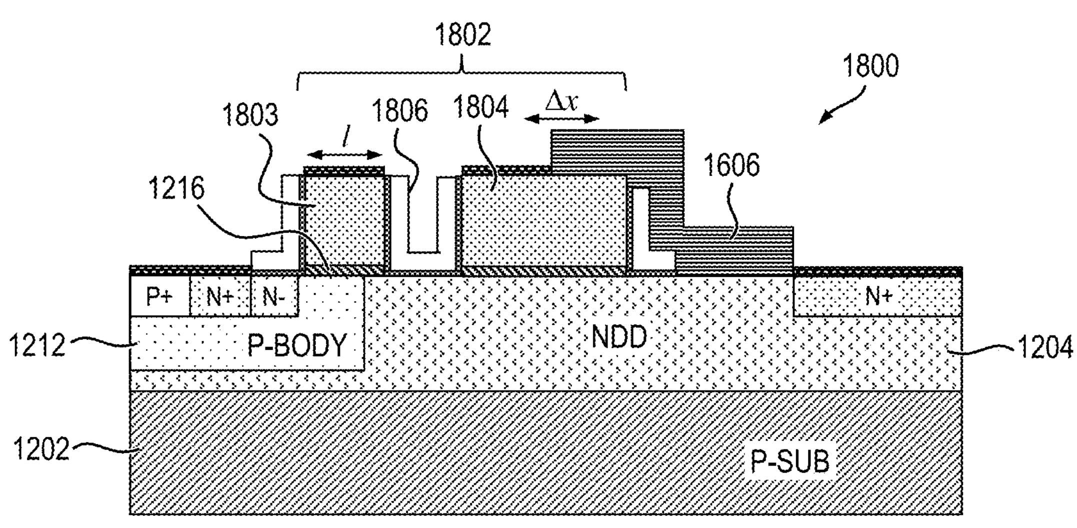
FIG. 18 is a cross-sectional view depicting at least a portion of an exemplary LDMOS device configured to reduce the impact of oxide boundary variation on the gate silicide length variation ratio, according to one or more embodiments of the invention.

FIG. 18 is a cross-sectional view depicting at least a portion of an exemplary LDMOS device 1800 configured to reduce the impact of oxide boundary variation on the gate silicide length variation ratio, according to one or more embodiments of the invention. Like the illustrative LDMOS device 1500 shown in FIG. 15, the LDMOS device 1800 includes a gate 1802 comprised of a control gate 1803 formed on the thin oxide layer 1216 proximate the body region 1212, and a field plate 1804 formed on the thin oxide layer 1216 proximate the upper surface of at least a portion of the NDD region 1204. The control gate 1803 and field plate 1804 are spaced apart laterally and electrically isolated from one another by an isolation structure 1806 formed above the NDD region 1204 between the control gate and field plate. Arranged in this manner, the control gate 1803 will not be impacted by the oxide boundary variation Δx of the silicide-blocking oxide structure 1606. Furthermore, the control gate 1803 can be fully silicided for advantageously providing a reduced gate charge $Q_g$ and a reduced and stable gate resistance $R_g$.

As apparent from FIG. 18, in the LDMOS device 1800, the silicide-blocking oxide structure 1606 is used to replace the high-voltage insulating layer 218 in the illustrative LDMOS device shown in FIG. 6E. In one or more embodiments, the oxide structure 1606 is formed as a stepped structure that is disposed on a portion of the upper surface of the field plate 1804, a sidewall of the field plate (which may include a sidewall spacer), and on a portion of the upper surface of the NDD region 1204, so as to overlap a corner of the field plate. One advantage of fabricating the LDMOS device 1800 in this manner is that it provides a beneficial reduction in the number of required process steps. More particularly, for low-voltage LDMOS, the thick oxide layer (218 in FIG. 6E) is not required in order to sustain the drain voltage, and therefore the oxide structure 1606 can replace the thick oxide layer 218 in the device of FIG. 6E. This oxide structure 1606 also serves to block a silicide layer, which may otherwise be undesirably formed on the upper surface of the NDD region 1204 (between the field plate 1804 and drain region), and does not require an extra thick oxide process to prevent unwanted silicidation of the NDD region.

Figure 19:
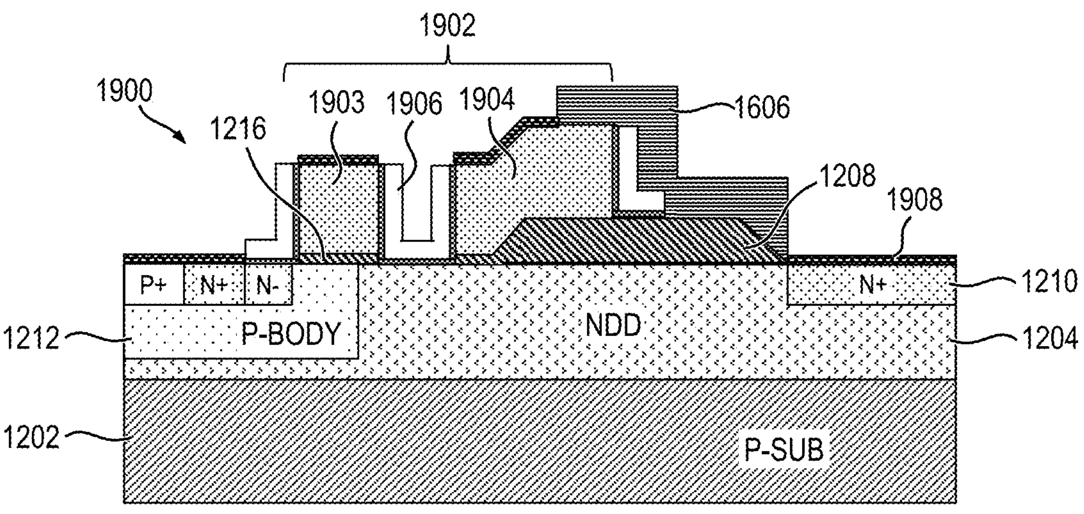
FIG. 19 is a cross-sectional view depicting at least a portion of an exemplary LDMOS device that combines the novel fabrication techniques used to form the illustrative LDMOS device shown in FIG. 18 with the thick oxide structure of the illustrative LDMOS device shown in FIG. 15, according to one or more embodiments of the present invention.
Figure 20:
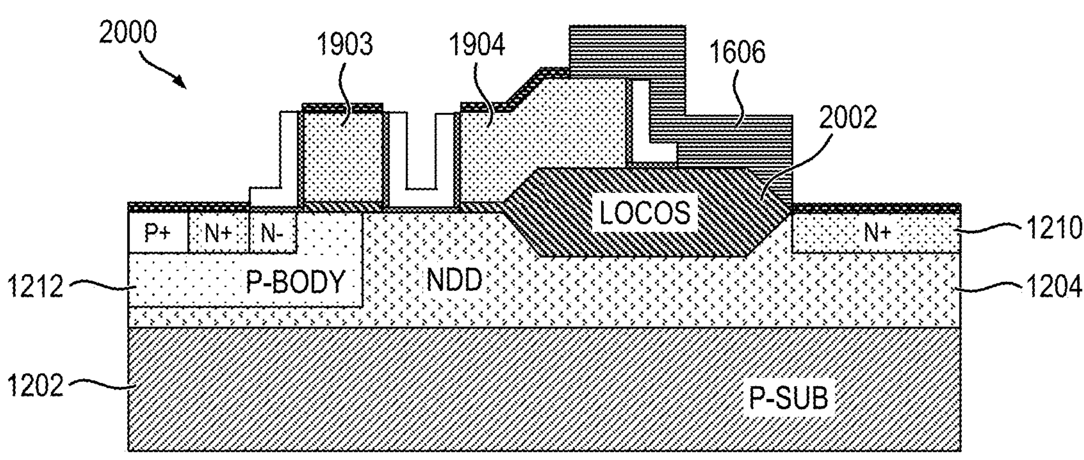
FIG. 20 is a cross-sectional view depicting at least a portion of an exemplary LDMOS device that combines the novel fabrication techniques used to form the illustrative LDMOS device shown in FIG. 18 with the LOCOS techniques used to form the illustrative LDMOS device shown in FIG. 10, according to one or more embodiments of the present invention.
Figure 21:
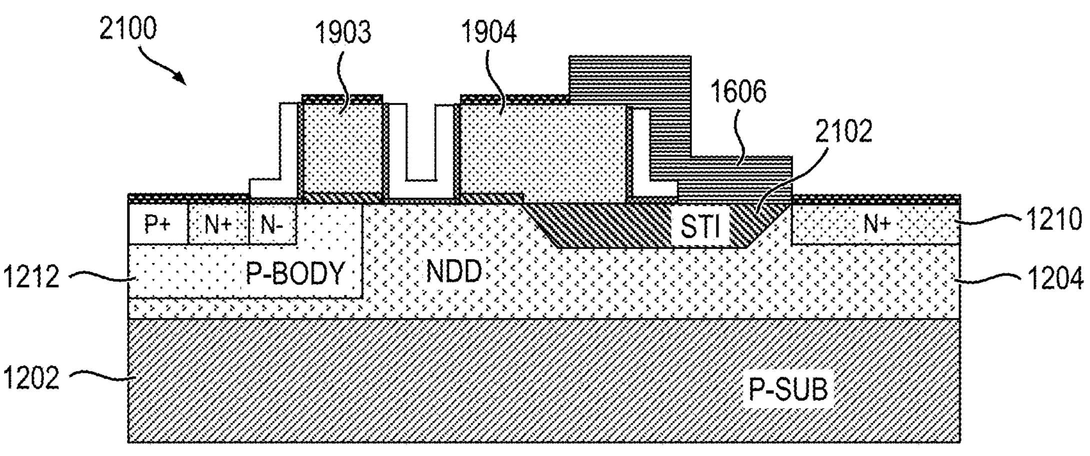
FIG. 21 is a cross-sectional view depicting at least a portion of an exemplary LDMOS device that combines the novel fabrication techniques used to form the illustrative LDMOS device shown in FIG. 18 with the STI techniques used to form the illustrative LDMOS device shown in FIG. 11, according to one or more embodiments of the present invention.

Techniques according to aspects of the invention can be extended for use in combination with other isolation structures, examples of which are shown in FIGS. 19-21, without limitation or loss of generality. More particularly, FIG. 19 is a cross-sectional view depicting at least a portion of an exemplary LDMOS device 1900 that combines the novel fabrication techniques used to form the LDMOS device 1800 of FIG. 18 with the thick oxide structure 1208 used in the LDMOS device 1500 shown in FIG. 15, according to one or more embodiments of the invention. With reference now to FIG. 19, the LDMOS device 1900 includes a gate 1902 comprising a control gate 1903 formed on the thin oxide layer 1216, and a field plate 1904 formed on at least a portion of the thick oxide structure 1208. The control gate 1903 and field plate 1904 are spaced apart laterally and electrically isolated from one another by an isolation structure 1906 formed above the NDD region 1204 between the control gate and field plate.

As previously explained, when arranged in this manner, the control gate 1903 will not be impacted by the thick oxide boundary variation inherent in the fabrication process. Using lithographic patterning and etching, the oxide structure 1606 is formed on at least a portion of the upper surface of the field plate 1904 and the thick oxide structure 1208, leaving exposed the drain region 1210 and a portion of the field plate for subsequently forming a silicide layer 1908 thereon. The oxide structure 1606 blocks at least a portion of the field plate 1904 from being silicided, while at the same time allowing the control gate 1903 to be fully silicided for providing reduced and stable gate charge $Q_g$ and gate resistance $R_g$. Forming the LDMOS device 1900 in this manner advantageously provides a more relaxed fabrication process window. Specifically, by insulating a left boundary of the oxide structure 1606 from being disposed directly on the thick oxide structure 1208, which can cause process defects, there is a beneficial improvement in yield.

Similarly, FIG. 20 is a cross-sectional view depicting at least a portion of an exemplary LDMOS device 2000 that combines the novel fabrication techniques used to form the LDMOS device 1800 shown in FIG. 18 with the LOCOS techniques used to form the LDMOS device 1000 shown in FIG. 10, according to one or more embodiments of the invention. With reference now to FIG. 20, the LDMOS device 2000 is essentially the same as the LDMOS device 1900 depicted in FIG. 19, only with the thick oxide structure 1208 replaced by a LOCOS structure 2002.

As previously described in conjunction with FIG. 10, during LOCOS processing, areas of the wafer not meant to be oxidized are coated in a material that prevents diffusion of oxygen at high temperatures (e.g., about 800 to 1200° C.). The LOCOS structure 2002 is formed, in one or more embodiments, by thermal oxidation of silicon in the NDD region 1204. During this high-temperature process, the silicon wafer is "consumed" and "replaced" by silicon oxide. The field plate 1904 is then formed on at least a portion of the LOCOS structure 2002 in a manner consistent with the formation of the field plate on the thick oxide structure 1208 shown in FIG. 19.

Similarly, FIG. 21 is a cross-sectional view depicting at least a portion of an exemplary LDMOS device 2100 that combines the novel fabrication techniques used to form the illustrative LDMOS device 1800 shown in FIG. 18 with the STI techniques used to form the illustrative LDMOS device 1100 shown in FIG. 11, according to one or more embodiments of the invention. With reference now to FIG. 21, the LDMOS device 2100 is essentially the same as the LDMOS device 1900 depicted in FIG. 19, only with the thick oxide structure 1208 replaced by an STI structure 2102.

The STI structure 2102 is typically formed early during the semiconductor device fabrication process; before transistors and other active components are formed. In one or more embodiments, the STI structure 2102 is formed by etching a trench in a portion of the NDD region 1204 between the body region 1212 and the drain region 1210, depositing one or more dielectric materials (e.g., silicon dioxide) to fill the trenches, and removing the excess dielectric material using a planarization process (e.g., CMP). The field plate 1904 is then formed on at least a portion of an upper surface of the STI structure 2102 in a manner consistent with the formation of the field plate on the thick oxide structure 1208 shown in FIG. 19. However, since the STI structure 2102 is substantially planar with the upper surface of the wafer, the field plate 1904 will be formed over the NDD region 1204 such that it is substantially planar with the control gate 1903; that is, the field plate 1904 will not be formed as a stepped structure as in FIGS. 19 and 20 but will be formed in a same plane as the control gate 1903.

Figure 22:
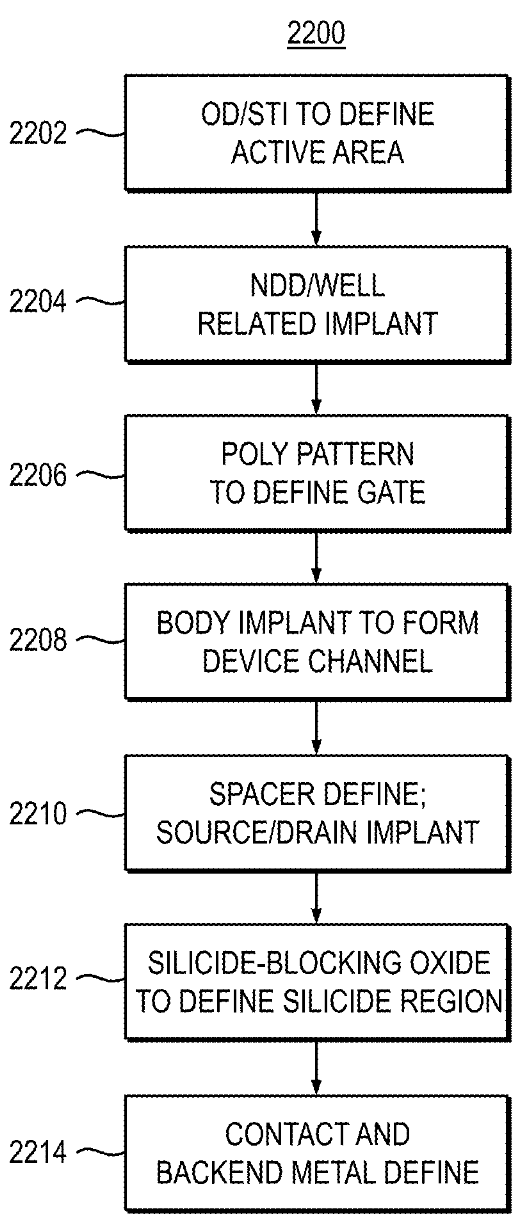
FIG. 22 is a flow diagram depicting at least a portion of an exemplary method for fabricating an LDMOS device having reduced sensitivity to oxide boundary variation on gate silicide length variation ratio, according to one or more embodiments of the present invention.

FIG. 22 is a flow diagram depicting at least a portion of an exemplary method 2200 for fabricating an LDMOS device having reduced sensitivity to oxide boundary variation on gate silicide length variation ratio, according to one or more embodiments of the invention. With reference to FIG. 22, the method 2200 begins in step 2202 by using an oxide diffusion (OD), STI, or other process, to define an active area in a semiconductor structure. The LDMOS device will ultimately be formed in this active area. In step 2204, an implant process (e.g., ion implantation) is used to form an NDD or well region of the LDMOS device.

After forming a layer of polysilicon on an oxide layer on an upper surface of the structure, the polysilicon layer is patterned, for example using a standard photolithographic process, to define a gate of the LDMOS device in step 2206. The gate, in one or more embodiments, is formed as a multiple-segment structure, including control gate and field plate portions (e.g., 1503 and 1504, respectively, in FIG. 15), as previously described. In step 2208, a body implant process is implemented to form a channel in the LDMOS device. Next, in step 2210, insulating (e.g., dielectric) spacers are formed on at least sidewalls of the gate and field plate portions, and/or between the control gate and field plate portions (e.g., isolation structure 1506 in FIG. 15). An implant process (e.g., ion implantation, etc.) is then used in step 2210 to form source and drain regions in the LDMOS device. The source and/or drain regions are preferably self-aligned with the insulating spacers.

Next, in step 2212, a layer of oxide is formed on the upper surface of the device, followed by lithographic patterning and etching, to form a silicide-blocking oxide structure (e.g., 1606 in FIG. 16). The silicide-blocking oxide structure, as the name suggests, is preferably used to block the formation of a silicide layer on the upper surface of the NDD region in the LDMOS device, and can also be used to prevent the field plate portion of the gate from being fully silicided. The silicide-blocking oxide structure is used to replace a high-voltage insulating layer (e.g., 218 in FIG. 2) in the LDMOS device. Formation of the silicide-blocking oxide structure beneficially reduces the number of process steps needed, as compared to other LDMOS device fabrication techniques. In step 2214, contact, vias and/or other backend metal (e.g., M1, M2, etc.) is defined, for example using standard metallization techniques.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having LDMOS devices therein formed in accordance with one or more embodiments of the invention, such as, for example, radio frequency (RF) power amplifiers, power management IC, etc.

An integrated circuit in accordance with aspects of the present disclosure can be employed in essentially any high-frequency, high-power application and/or electronic system, such as, but not limited to, RF power amplifiers, power management ICs, etc. Suitable systems for implementing embodiments of the invention may include, but are not limited to, DC-DC converters. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A laterally-diffused metal-oxide semiconductor (LDMOS) device, comprising:

a semiconductor substrate of a first conductivity type;

a doped drift region of a second conductivity type formed on at least a portion of the substrate, the second conductivity type being opposite in polarity to the first conductivity type;

a body region of the first conductivity type formed in the doped drift region proximate an upper surface of the doped drift region;

source and drain regions of the second conductivity type formed proximate an upper surface of the body region and doped drift region, respectively, and spaced apart laterally from one another;

a gate structure comprising a control gate and a field plate, the control gate being formed over at least a portion of the body region, the field plate being formed over at least a portion of the doped drift region, the gate structure being disposed between the source and drain regions and electrically isolated from the body and doped drift regions by a first insulating layer formed between the gate structure and the body and doped drift regions; and an oxide structure formed on a portion of the field plate and a portion of the doped drift region, the oxide structure extending on an upper surface of the field plate and overlapping a corner of the field plate, wherein the oxide structure is vertically non-overlapping with the drain region, and wherein a continuous portion of the oxide structure extends from the field plate onto the doped drift region toward the drain region, a bottom surface of the continuous portion is in direct contact with a portion of the doped drift region having a second conductivity type doping concentration less than a second conductivity type doping concentration of the drain region, and the bottom surface of the continuous portion is free of direct contact with an isolation structure.

2. The LDMOS device according to claim 1, further comprising a silicide layer formed on an upper surface of the control gate, a portion of the upper surface of the field plate uncovered by the oxide structure, and an upper surface of the source and drain regions, wherein the oxide structure extends on a sidewall of the field plate.

3. The LDMOS device according to claim 2, wherein the control gate is fully silicided.

4. The LDMOS device according to claim 1, further comprising an isolation structure formed on the doped drift region between the control gate and the field plate.

5. The LDMOS device according to claim 4, wherein the isolation structure is formed on at least one sidewall of each of the control gate and the field plate.

6. The LDMOS device according to claim 1, further comprising a plurality of insulating spacers formed on at least sidewalls of the control gate and field plate, wherein the oxide structure extends on a sidewall of at least one of the insulating spacers.

7. The LDMOS device according to claim 1, wherein the control gate and field plate are formed substantially planar relative to one another such that an upper surface of the control gate is coplanar with a portion of the upper surface of the field plate covered by the oxide structure, and wherein the oxide structure has a stepped structure in a cross-sectional view.

8. The LDMOS device according to claim 1, wherein the oxide structure comprises an oxide-based material.

9. The LDMOS device according to claim 1, wherein an upper surface of the drain region is fully silicided and is free of the oxide structure thereon.

10. A laterally-diffused metal-oxide semiconductor (LDMOS) device, comprising:

a semiconductor substrate of a first conductivity type;

a doped drift region of a second conductivity type formed on at least a portion of the substrate, the second conductivity type being opposite in polarity to the first conductivity type;

a body region of the first conductivity type formed in the doped drift region proximate an upper surface of the doped drift region;

source and drain regions of the second conductivity type formed proximate an upper surface of the body region and doped drift region, respectively, and spaced apart laterally from one another;

a gate structure comprising a control gate and a field plate, the control gate being formed over at least a portion of the body region, the field plate being formed over at least a portion of the doped drift region, the gate structure being disposed between the source and drain regions and electrically isolated from the body and doped drift regions by a first insulating layer formed between the gate structure and the body and doped drift regions;

an oxide structure formed on a portion of the doped drift region and a first portion of an upper surface of the field plate; and a silicide layer formed on a second portion of the upper surface of the field plate that is uncovered by the oxide structure, wherein the oxide structure is vertically non-overlapping with the drain region, and wherein the control gate and the field plate are formed substantially planar relative to one another such that an upper surface of the control gate is coplanar with the first portion of the upper surface of the field plate covered by the oxide structure.

11. The LDMOS device according to claim 10, further comprising a shallow trench isolation (STI) structure formed in the doped drift region proximate the upper surface of the doped drift region, at least a portion of the field plate being formed on an upper surface of the STI structure such that the field plate is substantially planar with the control gate, at least a portion of the oxide structure being formed on the STI structure, the STI structure extending laterally in the doped drift region toward the drain region.

12. The LDMOS device according to claim 10, wherein the upper surface of the control gate is coplanar with the second portion of the upper surface of the field plate uncovered by the oxide structure.

13. The LDMOS device according to claim 10, wherein the oxide structure comprises an oxide-based material.

14. A method of fabricating a laterally-diffused metal-oxide semiconductor (LDMOS) device, the method comprising:

forming a doped drift region of a first conductivity type on at least a portion of a semiconductor substrate of a second conductivity type, the second conductivity type being opposite in polarity to the first conductivity type;

forming a body region of the second conductivity type in the doped drift region proximate an upper surface of the doped drift region;

forming source and drain regions of the first conductivity type proximate an upper surface of the body region and doped drift region, respectively, and spaced apart laterally from one another;

forming a gate structure comprising a control gate and a field plate, the control gate being formed over at least a portion of the body region, the field plate being formed over at least a portion of the doped drift region, the gate structure being disposed between the source and drain regions and electrically isolated from the body and doped drift regions by a first insulating layer formed between the gate structure and the body and doped drift regions; and forming an oxide structure on a portion of the field plate and a portion of the doped drift region, the oxide structure extending on an upper surface of the field plate and overlapping a corner of the field plate, wherein the oxide structure is vertically non-overlapping with the drain region, and wherein a continuous portion of the oxide structure extends from the field plate onto the doped drift region toward the drain region, a bottom surface of the continuous portion is in direct contact with a portion of the doped drift region having a first conductivity type doping concentration less than a first conductivity type doping concentration of the drain region, and the bottom surface of the continuous portion is free of direct contact with an isolation structure.

15. The method according to claim 14, further comprising forming a silicide layer on an upper surface of the control gate, a portion of the upper surface of the field plate uncovered by the oxide structure, and an upper surface of the source and drain regions.

16. The method according to claim 15, further comprising fully siliciding the control gate.

17. The method according to claim 14, further comprising forming an isolation structure on the doped drift region between the control gate and the field plate.

* * * * *